(12) United States Patent
Nakaya et al.

(10) Patent No.: US 6,418,072 B2
(45) Date of Patent: Jul. 9, 2002

(54) SEMICONDUCTOR INTEGRATED CIRCUIT

(75) Inventors: Yoshichika Nakaya; Shinichiro Ikeda; Yoshiharu Kato; Satoru Kawamoto, all of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/750,352

(22) Filed: Dec. 29, 2000

(30) Foreign Application Priority Data

Jan. 27, 2000 (JP) ........................................ 2000-018316

(51) Int. Cl.[7] ................................................ G11C 7/00
(52) U.S. Cl. .................... 365/201; 365/190; 365/230.03
(58) Field of Search ............................ 365/189.02, 190, 365/200, 201, 230.03

(56) References Cited

U.S. PATENT DOCUMENTS 5,732,040 A * 3/1998 Yabe ...................... 365/230.03
5,867,439 A * 2/1999 Asakura et al. ............. 365/222
6,104,653 A * 8/2000 Proebting .................... 365/203

* cited by examiner

*Primary Examiner*—Son Mai
(74) *Attorney, Agent, or Firm*—Arent Fox Kintner Plotkin & Kahn, PLLC

(57) ABSTRACT

The first switching circuit selects data of a predetermined bit from the input/output data in accordance with each of a plurality of testing modes and outputs the selected data as testing data. The second switching circuits receive the testing data and each bit of the input/output data, and select one of the input/output data and the testing data in accordance with the operation mode. In detail, each bit of the input/output data is respectively outputted to the memory cells during normal operation mode, and during testing mode the testing data is selected to be outputted to the memory cells as the common input/output data. Thus, write control for multiple kinds of data compressing test can be performed by using the simple first and second switching circuits. As a result, the control circuit for the data compressing test can be reduced in layout size.

9 Claims, 17 Drawing Sheets

SEMICONDUCTOR INTEGRATED CIRCUIT

BACKGROUND OF THE INVENTION

1. Field of the Invention

The present invention relates to a semiconductor integrated circuit having a function of data compressing test hat efficiently executes a read/write operation test by compressing data signals.

2. Description of the Related Art

The memory capacity of memory LSI such as DRAM (Dynamic Random Access Memory) has been increasing every year. Because of the increase of the memory capacity, the address spaces of these memory LSI can be sufficiently secured even in the case where the input/output terminals are 16 bits or 32 bits (in general, referred to as plural bits products). For example, a work memory that is used for a 32-bit microcomputer can be constructed using a single 32-bit memory LSI.

On the other hand, as the number of external terminals increases, the number of memory LSI that can be mounted on a test-use evaluation board tends to decrease. The efficiency of testing the memory LSI depends on the number of the input/output terminals of an LSI tester. For example, if the number of the input/output channels of an LSI tester is 256, 32 of DRAMs each having 8-bit input/output terminals can simultaneously are tested; however, only eight of DRAMs each having 32-bit input/output terminals can simultaneously be tested. As a result, the testing cost (especially testing for shipment) significantly increases.

Recently, to prevent the increase of the testing cost due to the increase of the input/output terminals, a memory LSI that has a data compression function of efficiently executing the read/write operation test by compressing data signals within the memory LSI has been developed.

FIG. 1 shows a memory core 10 of an SDRAM (Synchronous DRAM) having the data compressing function. This SDRAM has 32-bit input/output terminals. Each bit of the input/output data transmitted through input/output terminals also is referred to as DQ hereafter.

The memory core 10 has ninety-six memory cell arrays 12 (memory cell regions) that are arranged in eight rows in the vertical direction and in twelve columns in the horizontal direction in the figure.

One row of the memory cell arrays 12 is assigned one of blocks BLK0 to BLK7. The blocks BLK0, BLK4, blocks BLK1, BLK5, blocks BLK2, BLK6, and blocks BLK3, BLK7, respectively, are activated at the same time. The twelve memory cell arrays 12 that are constructed of four rows × three columns (reference characters A to H in the figure) correspond to predetermined DQs. The memory cells assigned character A correspond to DQ0, DQ1, DQ14, and DQ15. The memory cells assigned character B correspond to DQ2, DQ3, DQ12, and DQ13. The memory cells assigned character C correspond to DQ4, DQ5, DQ10, and DQ11. The memory cells assigned character D correspond to DQ6, DQ7, DQ8, and DQ9. The memory cells assigned character E correspond to DQ18, DQ19, DQ28, and DQ29. The memory cells assigned character F correspond to DQ16, DQ17, DQ30, and DQ31. The memory cells assigned character G correspond to DQ22, DQ23, DQ24, and DQ25. The memory cells assigned character H correspond to DQ20, DQ21, DQ26, and DQ27. Regions of memory cell arrays assigned characters A to H, each of which is constructed of twelve memory cell arrays 12, will be also referred to as groups A to H, respectively, hereafter.

Outside each of the groups B, D, F, and H, a column decoder 14 is arranged. A row decoder 16 is arranged between groups C, D and groups E, F. Word lines WL are wired to extend from the row decoder 16 towards the memory cell arrays 12 at both sides in the horizontal direction.

Between the memory cell arrays 12, a plurality of main data line pairs MDLP is wired along the vertical direction of the figure, and a plurality of sub data line pairs SDLP is wired along the horizontal direction. The sub data line pairs SDLP are connected to the main data line pairs MDLP by data line switches 18 indicated by black dots. That is, the data lines have a hierarchical structure. The groups A, B, the groups C, D, the groups E, F, and the groups G, H have the same structure (including mirror symmetry), respectively, except for the DQ numbers. Because of this, groups A, B are mainly explained hereinafter.

FIG. 2 shows the detailed layout of the groups A, B.

For each memory cell array 12, a plurality of bit line pairs BLP is wired along the vertical direction of the figure. In order to avoid interference, each bit line pair BLP is wired between bit line pairs BLP of other bit numbers. The bit line pairs BLP are connected to the sub data line pairs SDLP by column line switches 20, which are indicated by outline dots. The bit line pairs BLP, which are connected to a column line switch 20 formed between particular blocks (between BLK1 and BLK2, for example), are wired into the respective blocks (BLK1 and BLK2). The bit line pairs BLP that are connected to the column line switch 20 formed outside the blocks BLK0, BLK3 are wired into the blocks BLK0, BLK3, respectively.

The arrows indicated by thick lines in the figure show the data flows of the read operation and write operation. For example, the data to be read from a memory cell array 12 in the block BLK1 of the group B is transmitted to the exterior of group B through bit line pair BLP, column line switch 20, sub data line pair SDLP, data line switch 18, and main data line pair MDLP (FIG. 2 (i)). The data to be written to memory cell array 12 in the block BLK 4 (group A) is transmitted from the exterior to a memory cell (not shown in the figure) through main data line pair MDLP, data line switch 18, sub data line pairs SDLP, column line switch 20, and bit line pair BLP (FIG. 2 (ii)).

Each block (for example, BLK0 constructed of groups B, D, F, H shown in FIG. 1) has two word line relief circuits 22. The word line relief circuit 22 has a redundancy word line (not shown in the figure) and a plurality of redundancy memory cells (not shown in the figure) connected to the redundancy word line. Using the word line relief circuits 22, the blocks BLK0 to BLK7 each can relieve two word line defects or two bit defects.

Each of groups A to H has at least one bit line relief circuit 24. The bit line relief circuit 24 has a redundancy bit line pair (not shown in the figure), and a plurality of redundancy memory cells (not shown in the figure) connected to the redundancy bit line pair. Using the bit line relief circuit 24, the groups A to H each can relieve one bit line defect or one bit defect.

FIG. 3 shows a control circuit 26 formed between the blocks BLK0 and BLK1.

Bit line pairs BLP of the blocks BLK0, BLK1 are connected to a shared bit line pair SHBLP through bit line switches 28, which consist of an nMOS transistor. The bit line switches 28 are controlled by control signals BT0, BT1, respectively, which are activated in accordance with the column address. A sense amplifier 30 and a precharge circuit 32 are connected to the shared bit line pair SHBLP. When equalizing signal BRS is at the high level, the precharge circuit 32 supplies precharge voltage VPR to the shared bit line pair SHBLP and to the bit line pairs BLP that are connected to the shared bit line pair SHBLP by the control signals BT0, BT1. The sense amplifier 30 and precharge circuit 32 are shared by the blocks BLK0 and BLK1 through the bit line switches 28. The shared bit line pair SHBLP is connected to the sub data line pair SDLP through column switch 20 consisting of nMOS transistors. The gate of the column switch 20 is controlled by a column line selecting signal CL, which is activated in accordance with the column address. A data line switch 18, which connects the sub data line pair SDLP to the main data line pair MDLP, is constructed of nMOS transistors and an inverter. The gates of the data line switch 18 are controlled by a precharge signal BRS through the inverter. For example, the read operation of the block BLK0 is executed by changing the control signal BT0 and the column line selecting signal CL to the high level, and changing the control signal BT1 and the precharge signal BRS to the low level, thereby connecting the bit line pair BLP of the block BLK0, the shared bit line pair SHBLP, the sub data line pair SDLP, and the main data line pair MDLP.

FIG. 4 shows the control circuit 34 that is formed between the blocks BLK3 and BLK4 (between the groups A and B).

Because groups A, B have different bit numbers (DQs) for the data retained, each group has a control circuit of its own. The gates of the bit line switches 28 that are connected to one end of the shared bit line pair SHBLP are connected to the ground line VSS, and the other ends of these bit line switches 28 at the opposite side with respect to the bit line pair BLP are left open. At the block BLK3, the precharge circuit 32 and the data line switch 18 receive precharge signal BRS3, the column line switch 20 receives column line selecting signal CL, and switches 28 that are connected to the bit line pair BLP receive control signal BT3. At the block BLK4, the precharge circuit 32 and the data line switch 18 receive precharge signal BRS4, the column line switch 20 receives column line selecting signal CL, and the bit line switches 28 that are connected to the bit line pair BLP receive the control signal BT4.

Thus, at the boundary part of the groups A and B, sense amplifiers 30, precharge circuits 32, and the like are arranged for each group. Due to this, the layout area between the blocks BLK3 and BLK4 needs to be larger than the areas between other blocks.

FIG. 5 shows the data compressing circuit 36 for the write data in the conventional SDRAM.

The data compressing circuit 36 has eight buffer circuits 38 corresponding to input/output data signals DQ0 to DQ7, respectively, and a selecting circuit 40. The buffer circuits 38 receive the input/output data signal DQ0 to DQ7, and output them as write data signals DINCZ0 to DINCZ7, respectively. The selecting circuit 40 receives write data signals DINCZ0 to DINCZ7, and enable signal TEST8 for compressing test, and outputs write data signals DIN0 to DIN7.

FIG. 6 shows the details of the selecting circuit 40.

The selecting circuit 40 is constructed of eight switching circuits 42 corresponding to write data signals DINCZ0 to DINCZ7, respectively, and inverters 40a, 40b, and 40c, which control the switching circuits 42. The switching circuits 42 each have a CMOS transmission gate 42a, which transmits a signal that is supplied to terminal D1 through an inverter, and a CMOS transmission gate 42b, which transmits a signal supplied to the terminal D2. The outputs of the CMOS transmission gates 42a and 42b are connected to each other, and are connected to the terminals D0 through two cascade-connected inverters. The CMOS transmission gates 42a and 42b are controlled by a signal that has the same phase as that of the enable signal TEST8 and also by a signal that has a phase opposite to that of the enable signal TEST8.

The CMOS transmission gate 42a is turned on when the enable signal TEST8 is at the low level (normal operation). The CMOS transmission gate 42b is turned on when the enable signal TEST8 is at the high level (data compressing test). The terminal D2 of each of the selecting circuits 42 receives the inverted signal of the write data signal DINCZ7 through the inverter 40c. That is, in the normal operation, the write data signals DINCZ 0–7 are transmitted as the write data signals DIN 0–7. When in the data compressing test, the 8-bit input/output terminals are compressed into 1-bit, and the write data signal DINCZ7 is transmitted as write data signals DIN 0–7. Although not particularly shown in the figure, the same structured selecting circuits 40 are formed for the input/output data signals DQ8 to DQ15, DQ16 to DQ 23, and DQ24 to DQ31, respectively.

An evaluation board of an LSI tester that evaluates this SDRAM can executes the read/write operation test for one SDRAM using only 4-bit (DQ7, DQ15, DQ23, DQ31) input/output channels. For example, it is feasible of testing as many as sixty-four SDRAMs at a time in an LSI tester having 256 input/output channels.

The data compressing tests are often executed for confirming operations of chips at the time of probe testing (the relief determination) when chips are still on wafers and at the time of final testing after package assembly.

Here, because such data compressing test compresses the input/output data when testing, in cases where a defect is found during the test, it cannot determine which bit of the input/output data has the defect. For example, as marked by "×" in FIG. 2, if the DQ2 of the block BLK0 actually has a bit defect, and a word line defect occurred, the data compressing test cannot determine which one of the groups A, B, C, and D has that defect. Because of this, in order to relieve this defect using word line relief circuits 22, the word line relief circuits 22 of both blocks BLK0, BLK4 have to be used. Thus, the relief efficiency (the usage efficiency of the word line relief circuits 22) is low because the word line in block BLK4 that is operating normally also is relieved. As a result, there were the problems of decrease in the yield and increase in the manufacturing cost.

The relief address, relief DQ, can be confirmed by the normal read/write operation test without using the data compressing test technique. However, in that case, the number of the memory LSIs that can be tested simultaneously by an LSI tester decreases (from sixty-four to eight memory LSI in the above-mentioned example). Accordingly, the manufacturing cost (testing cost) significantly increases.

It is possible to prevent the decrease in relief efficiency by adding data compressing test control circuits corresponding to the number of DQs (in the above example, 4-bit) of each memory cell array 12 and making variable the number of bits to be compressed. However, in this case, new selecting circuits other than the ones shown in FIG. 6 need to be formed. As a result, a larger layout size is necessary, resulting in an increase in chip size.

In addition, there has been a drawback that a layout size increases between the blocks BLK3 and BLK4 shown in FIG. 4 unlike between the other blocks because the sense amplifier 30 and the precharge circuit 32 are arranged for each of the blocks BLK3 and BLK 4.

SUMMARY OF THE INVENTION

An object of the present invention is to improve defect relief efficiency by using a data compressing test function.

Another object of the present invention is to reduce a semiconductor integrated circuit in chip size. Another object of the present invention is to reduce particularly a semiconductor integrated circuit having a data compressing test function in size.

According to one of the aspects of the semiconductor integrated circuit in the present invention, the semiconductor integrated circuit has a plurality of input/output terminals for transmitting input/output data, a plurality of memory cells for retaining the input/output data, a first switching circuit, and a plurality of second switching circuits. The first switching circuit selects data of a predetermined bit from the input/output data in accordance with each of a plurality of testing modes and outputs the selected data as testing data. The plurality of second switching circuits is formed in correspondence with the plurality of input/output terminals, respectively. The second switching circuits receive the testing data and each bit of the input/output data, and select one of the input/output data and the testing data in accordance with the operation mode. In detail, each bit of the input/output data is respectively outputted to the memory cells during normal operation mode. During testing mode the testing data is selected to be outputted to the memory cells as the common input/output data. That is, the data compressing test is executed. Thus, write control for multiple kinds of data compressing test can be performed by using the simple first and second switching circuits. As a result, the control circuit for the data compressing test can be reduced in layout size, whereby prevents increase in chip size. The load of data outputted from the second switching circuits does not fluctuate in the normal operation mode and in the plurality of testing modes because the testing data corresponding to the plurality of data compressing tests is selected by the first switching circuit. This facilitates timing design.

According to another aspect of the semiconductor integrated circuit in the present invention, the semiconductor integrated circuit has a plurality of memory cell arrays assigned a plurality of bits with different numbers from each other. Each memory cell array has a relief circuit for relieving a defect which occurs at a predetermined address. The number of the second switching circuits that receive single testing data in the testing mode is set less than or equal to the number of bits assigned to each memory cell array. In other words, the number of bits written testing data is less than or equal to the number of bits that is relieved at once by the relief circuit. This makes it possible to determine defects during the testing mode (data compressing test) for every memory cell array, which allows relief of the defects by using only the relief circuit in the memory cell array where a defect actually occurs. Even when the data compressing test is applied to relief determination, the efficient use of the relief circuit enables prevention of a decease in relief efficiency.

According to another aspect of the semiconductor integrated circuit in the present invention, the semiconductor integrated circuit has a latch, between the first switching circuit and the second switching circuits, for retaining testing data. Therefore, even when the output of the first switching circuit is at high impedance, a high or low level is supplied to the second switching circuits. This prevents malfunction of the second switching circuits and occurrence of a feedthrough current.

According to another aspect of the semiconductor integrated circuit in the present invention, the latch has a reset circuit for receiving a reset signal that is activated when the power is turned on and resetting the latch to a predetermined internal state. Thus, the latch is initialized with reliability when the power is on, thereby preventing occurrence of a feedthrough current.

According to another aspect of the semiconductor integrated circuit in the present invention, the semiconductor integrated circuit further has a buffer for providing input/output data to the second switching circuits. The first switching circuit is provided with input/output data transmitted at a node located between the input/output terminals and the buffer. Therefore, the loads of the input/output data supplied to the second switching circuits can be all equalized. This prevents an undesirable shift of timing of supplying a specific bit, that is to be used in the testing mode, to the second switching circuit.

According to another aspect of the semiconductor integrated circuit in the present invention, the semiconductor integrated circuit has a plurality of input/output terminals for transmitting input/output data, a plurality of memory cell regions, bit line switches corresponding to each memory cell region, and a sense amplifier. Each memory cell region is assigned bits with different numbers from each other, of the input/output data, and different addresses from each other. The bit line switches connect bit lines respectively connected to memory cells in each memory cell region, with shared bit lines. The sense amplifier connected to the shared bit lines, amplifies data on the bit lines that are transmitted through the bit line switches. For example, when a memory cell region is accessed, only the bit line switches corresponding to that memory cell array are turned on, and data of a specified bit among the input/output data is transmitted between the bit lines and the shared bit lines. The sense amplifier amplifies the data transmitted to the shared bit lines. When the other memory cell region is accessed, only the bit line switches corresponding to that memory cell region are turned on, and data of a different bit from the previous data among the input/output data is transmitted between the bit lines and the shared bit lines. The sense amplifier amplifies the different data transmitted to the shared bit lines. The sense amplifier is shared among the input/output data of different bits from each other. As a result, the sense amplifiers can be reduced in number, the memory cell regions can be reduced in layout size, and the chip size can be reduced.

According to another aspect of the semiconductor integrated circuit in the present invention, the semiconductor integrated circuit has data line switches for respectively connecting the shared bit lines and data lines corresponding to a predetermined bit assigned to each memory cell region. Therefore, data of a predetermined bit corresponding to the memory cell region is transmitted with certainty between the memory cell region and the data lines.

According to another aspect of the semiconductor integrated circuit in the present invention, the shared bit lines are respectively connected to two memory cell regions via bit line switches. A control signal for activating the bit line switches corresponding to the bit of one of memory cell region is used for inactivating the data line switch corresponding to the bit of the other memory cell region. That is, the bit lines in one memory cell region are activated while the bit lines in the other memory cell region are inactivated. Accordingly, the data line switches corresponding to the two memory cell regions are easily controlled without being formed a special signal generation circuit.

According to another aspect of the semiconductor integrated circuit in the present invention, the semiconductor integrated circuit has a testing mode in which the plurality of bit line switches are concurrently turned on to write input/output data at once to each of the memory cell regions. At least one data line switch is turned on during the testing mode so that input/output data can be written to memory cell regions corresponding to the other data lines by using a part of the data lines. That is, the data compressing test can be executed under simple control.

According to another aspect of the semiconductor integrated circuit in the present invention, turning on a plurality of bit line switches simultaneously makes it possible to activate all word lines connected to the memory cells to perform a burn-in test where the memory cells are applied stress.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

The embodiments of the present invention will now be described with reference to the accompanying drawings.

Figure 7:
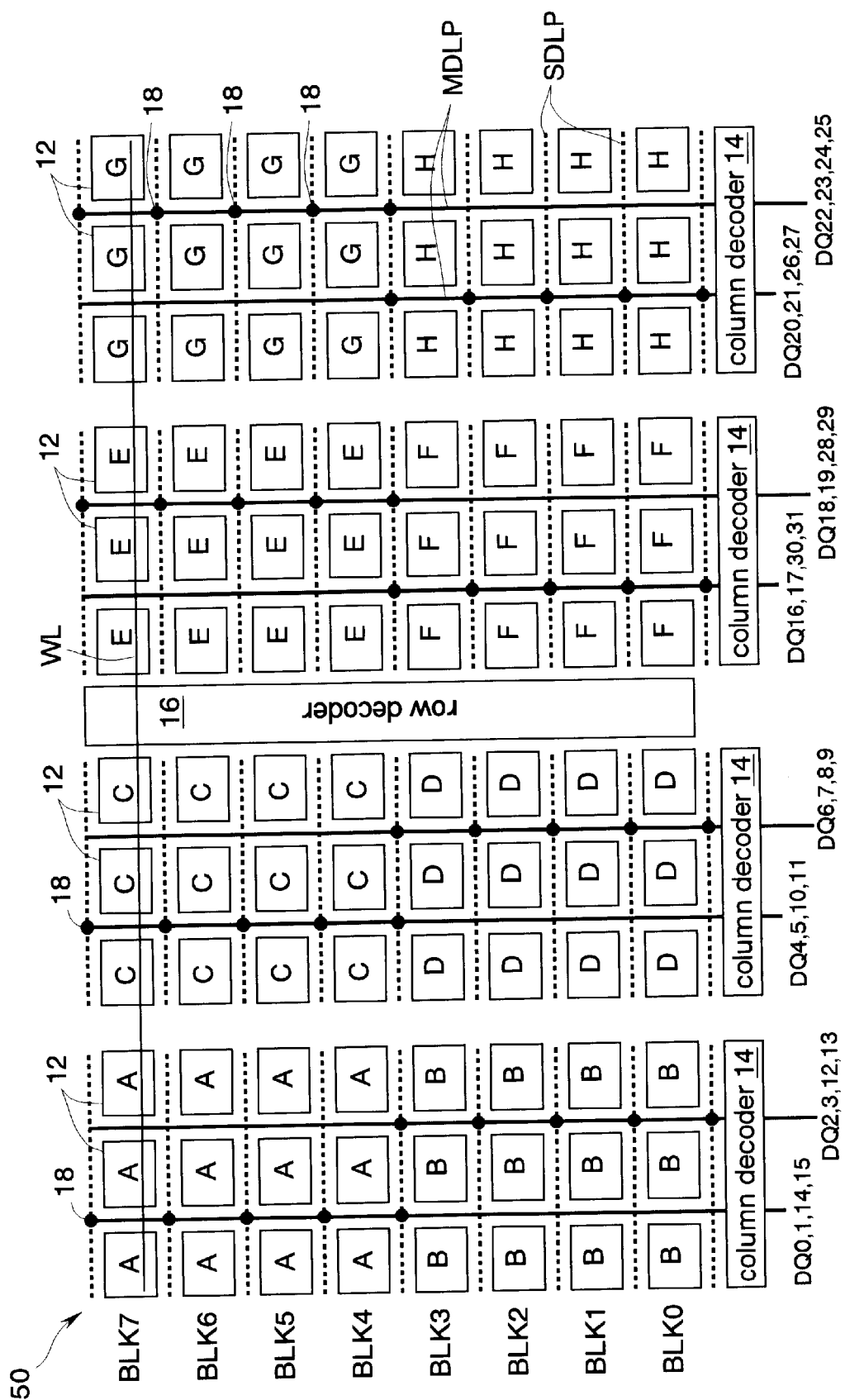
FIG. 7 is a layout diagram showing the memory core in a first embodiment.

FIG. 7 shows a memory core of a semiconductor integrated circuit according to a first embodiment of the present invention. The circuits that are the same as those of the conventional art have the same reference characters, and detailed explanations of such circuits are omitted.

The semiconductor integrated circuit is formed on a silicon substrate using the CMOS process as an SDRAM having a data compressing function. The SDRAM has 32-bit input/output terminals that transmit input/output data.

This memory core 50 of the SDRAM has ninety-six memory cell arrays 12 (memory cell regions) that are arranged in eight rows in the vertical direction and in twelve columns in the horizontal direction in the figure. Each of the memory cell arrays 12 has a plurality of memory cells. Although not particularly shown in the figure, write amplifiers for use in data writing, sense buffers for use in data reading, and the like are formed at the periphery of the memory core 50.

Each row of the memory cell arrays 12 is assigned one of blocks BLK0 to BLK7. The blocks BLK0, BLK4, the blocks BLK1, BLK5, the blocks BLK2, BLK6, and the blocks BLK3, BLK7, respectively, are activated at the same time. For example, if a certain address is supplied from the exterior, the blocks BLK0, BLK4 are concurrently activated. The twelve memory cell arrays 12 constructed of four rows × three columns correspond to specific DQs. Regions consisting of the memory cell arrays 12 are referred to as groups A to H in the same manner as in the conventional art.

Outside each group B, D, F, and H, a column decoder 14 is arranged respectively. Between the groups C, D and the groups E, F, a row decoder 16 is arranged. From the row decoder 16, word lines WL are wired to the memory cell arrays 12 at the both sides in the horizontal direction.

Between the memory cell arrays 12, a plurality of main data line pairs MDLP is wired along the vertical direction in the figure, and a plurality of sub data line pairs SDLP is wired along the horizontal direction. The sub data line pairs SDLP are connected to the main data line pairs MDLP by data line switches 18 shown by the black dots. That is, the data lines have a hierarchical structure.

Between the blocks BLK3 and BLK4, a sub data line pair SDLP connected with the data line switches 18 corresponding to the upper groups in the figure and the data line switches 18 corresponding to the lower groups, is formed.

Figure 1:
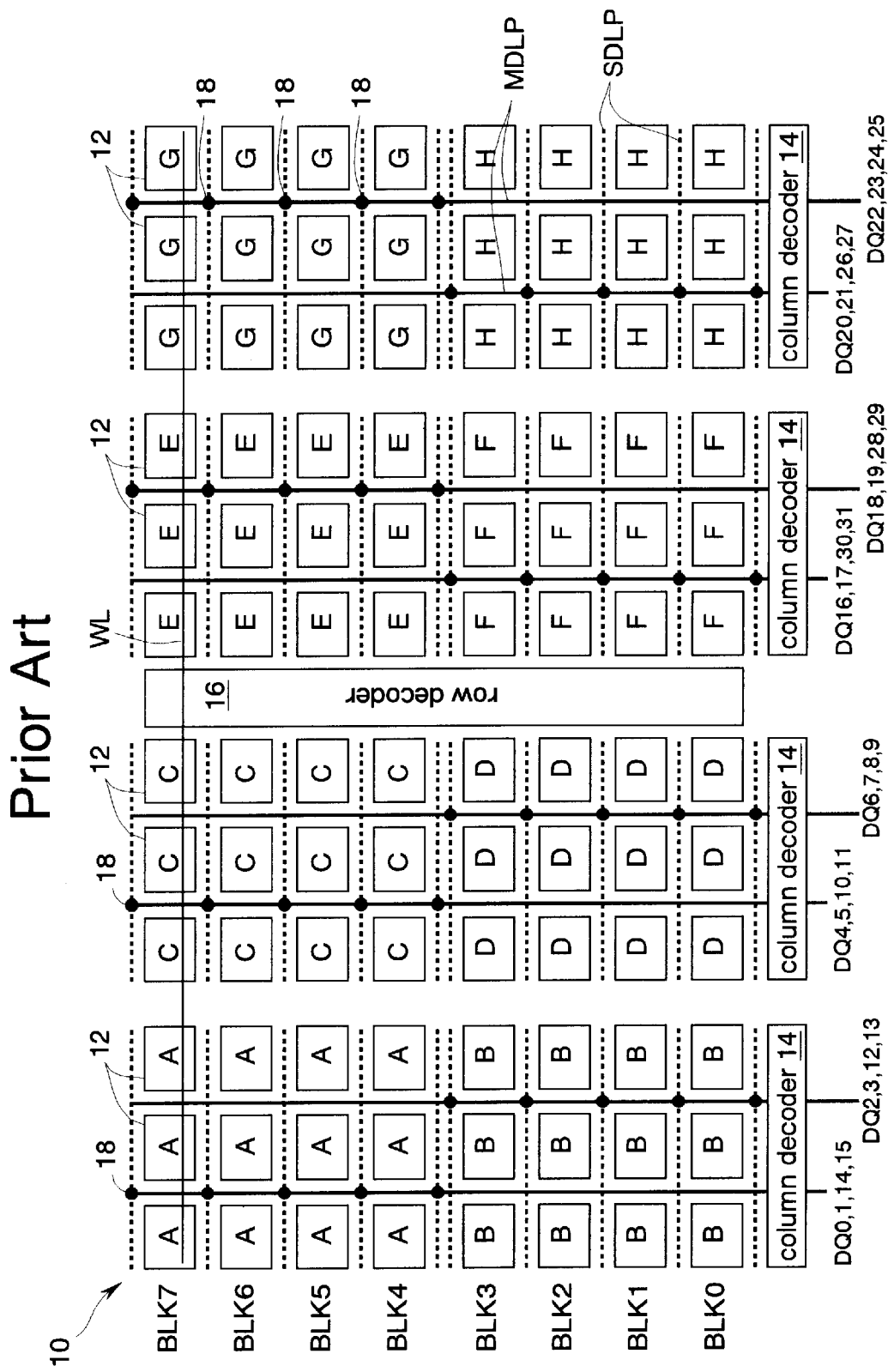
FIG. 1 is a layout diagram showing a memory core in a conventional SDRAM.
Figure 2:
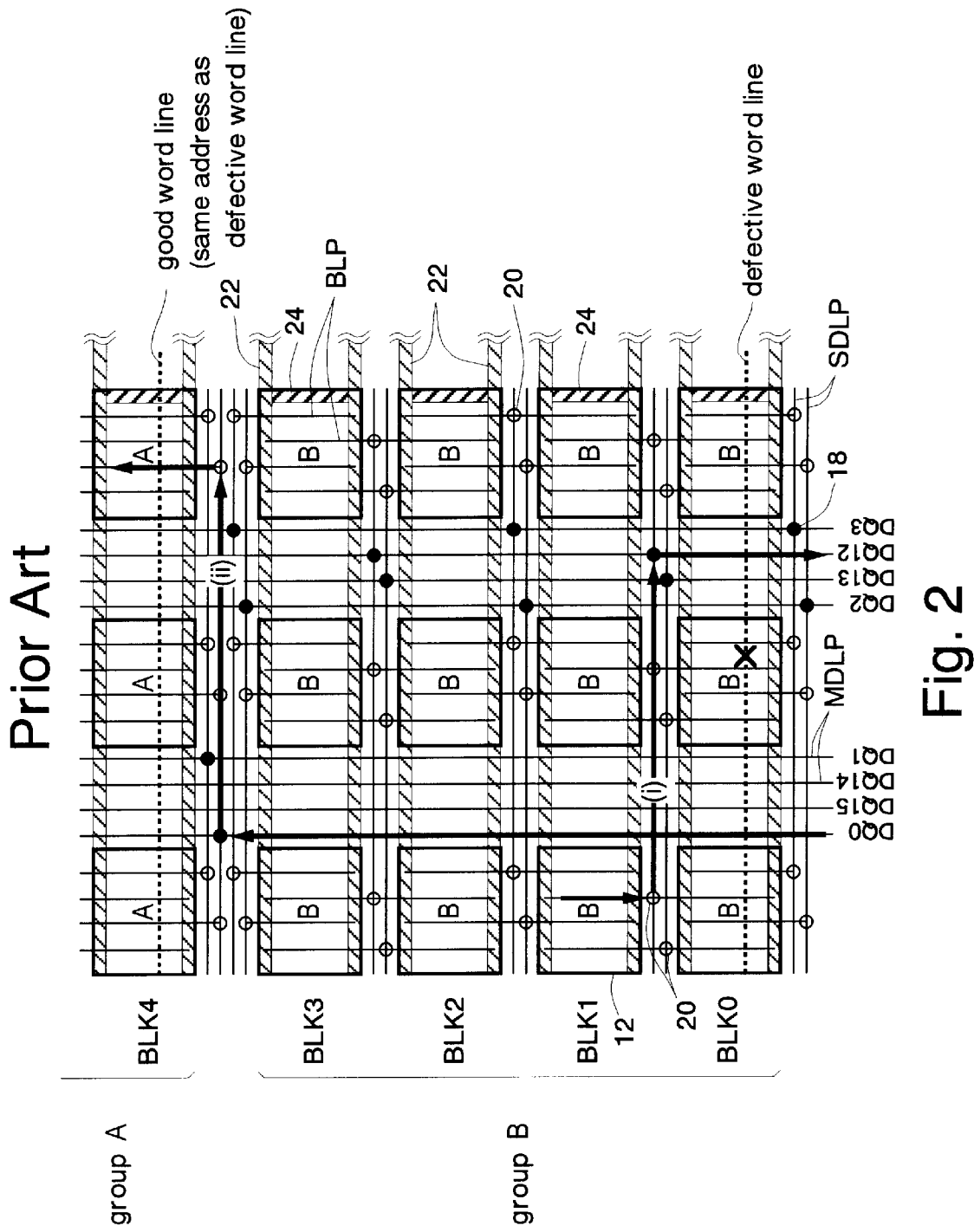
FIG. 2 is a layout diagram showing the main part in detail in FIG. 1.
Figure 8:
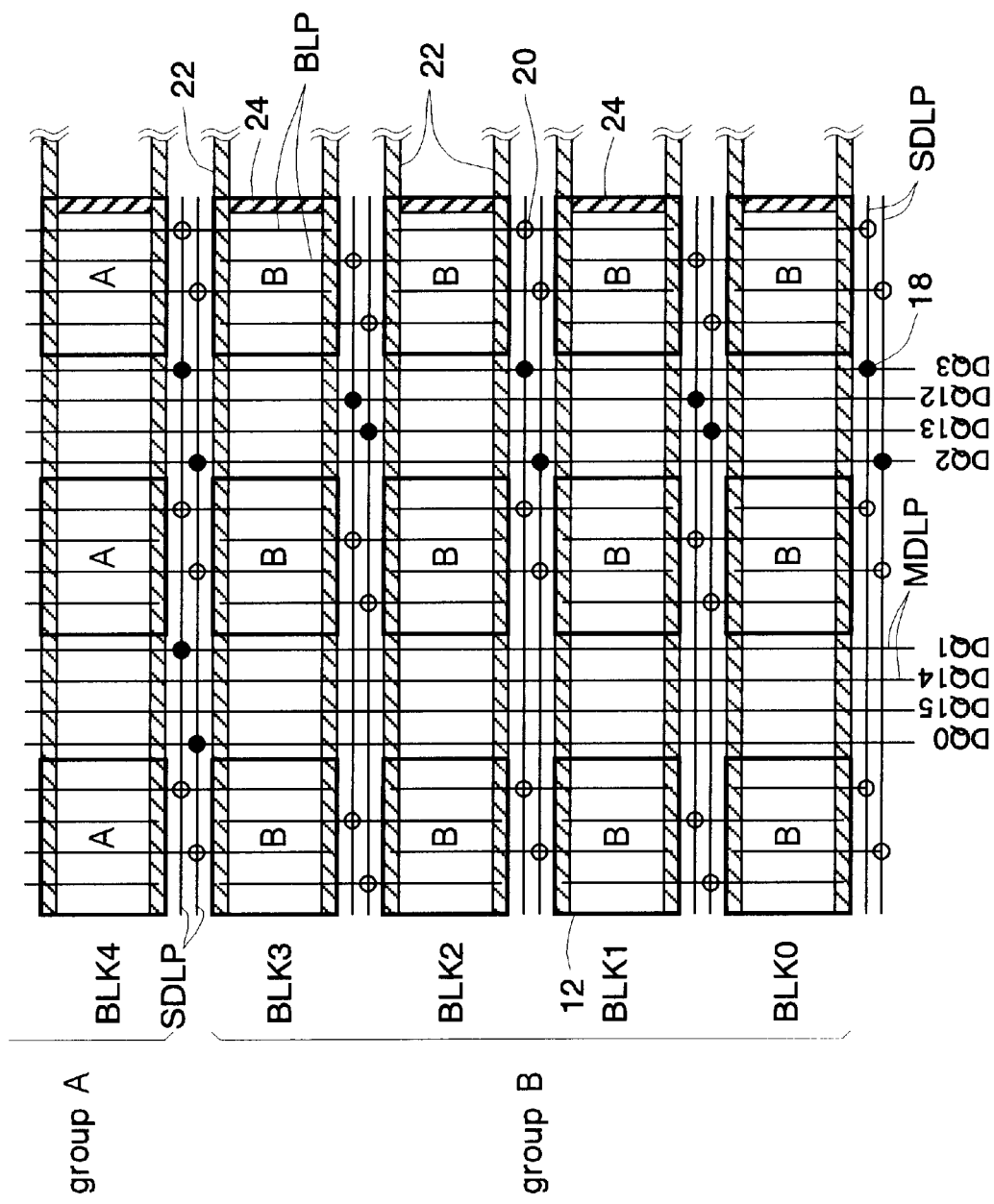
FIG. 8 is a layout diagram showing the main part in detail in FIG. 7.

FIG. 8 shows the layout of groups A and B in detail. Here, only elements that are different from those of the conventional art in FIG. 2 are explained. As in the case of the conventional art, each block (for example, BLK0 that is constructed of groups B, D, F, and H shown in FIG. 7) has two word line relief circuits 22 (redundancy circuits), and each group A to H has at least one bit line relief circuit 24 (redundancy circuit).

Bit line pairs BLP of the blocks BLK3 and BLK4 are connected to the sub data line pair SDLP wired between the blocks BLK3 and BLK4 by column line switches 20 shown by outline dots. That is, the sub data line pair SDLP wired between the blocks BLK3 and BLK4 is used for DQ2 and DQ3 when the block BLK3 is operated, and is used for DQ0 and DQ1 when the block BLK4 is operated.

Here, the structure of the data lines is not limited to the ones wired between the blocks. For example, it may be a structure with data lines wired above (across) the memory array cells.

Figure 3:
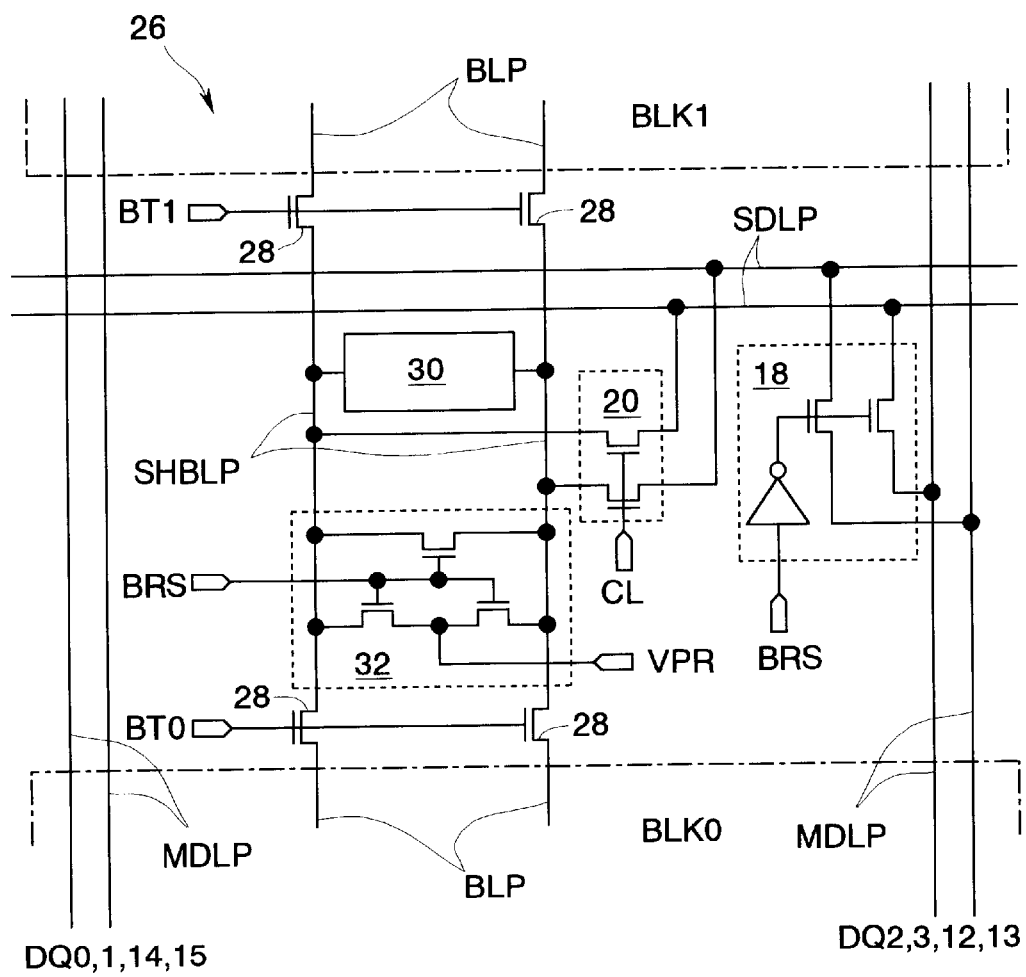
FIG. 3 is a circuit diagram showing a controlling circuit formed between blocks in the conventional SDRAM.
Figure 9:
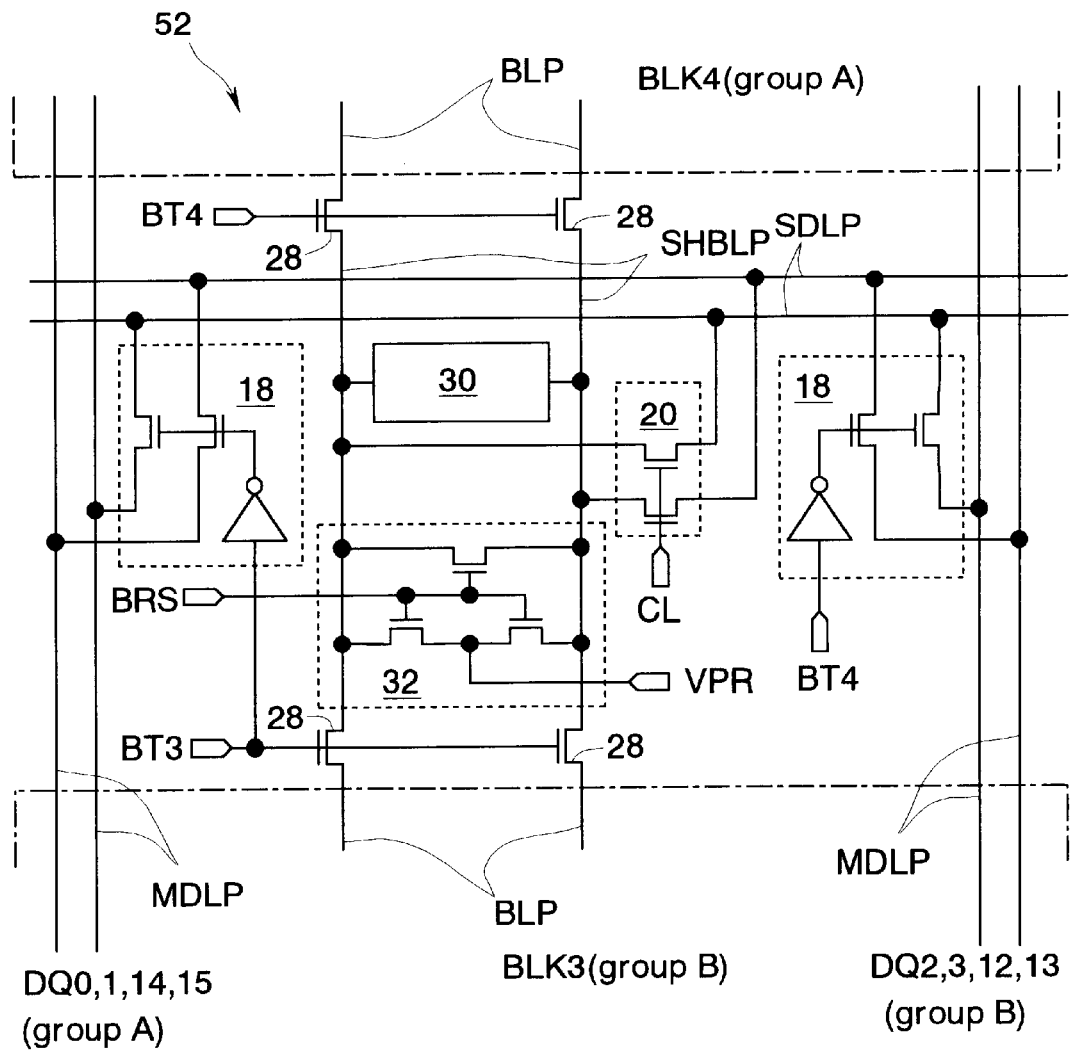
FIG. 9 is a circuit diagram showing a controlling circuit formed between blocks.

FIG. 9 shows a control circuit 52 formed between the blocks BLK3 and BLK4. Between other blocks, a control circuit 26 same as that of the conventional art (FIG. 3) is formed.

Figure 4:
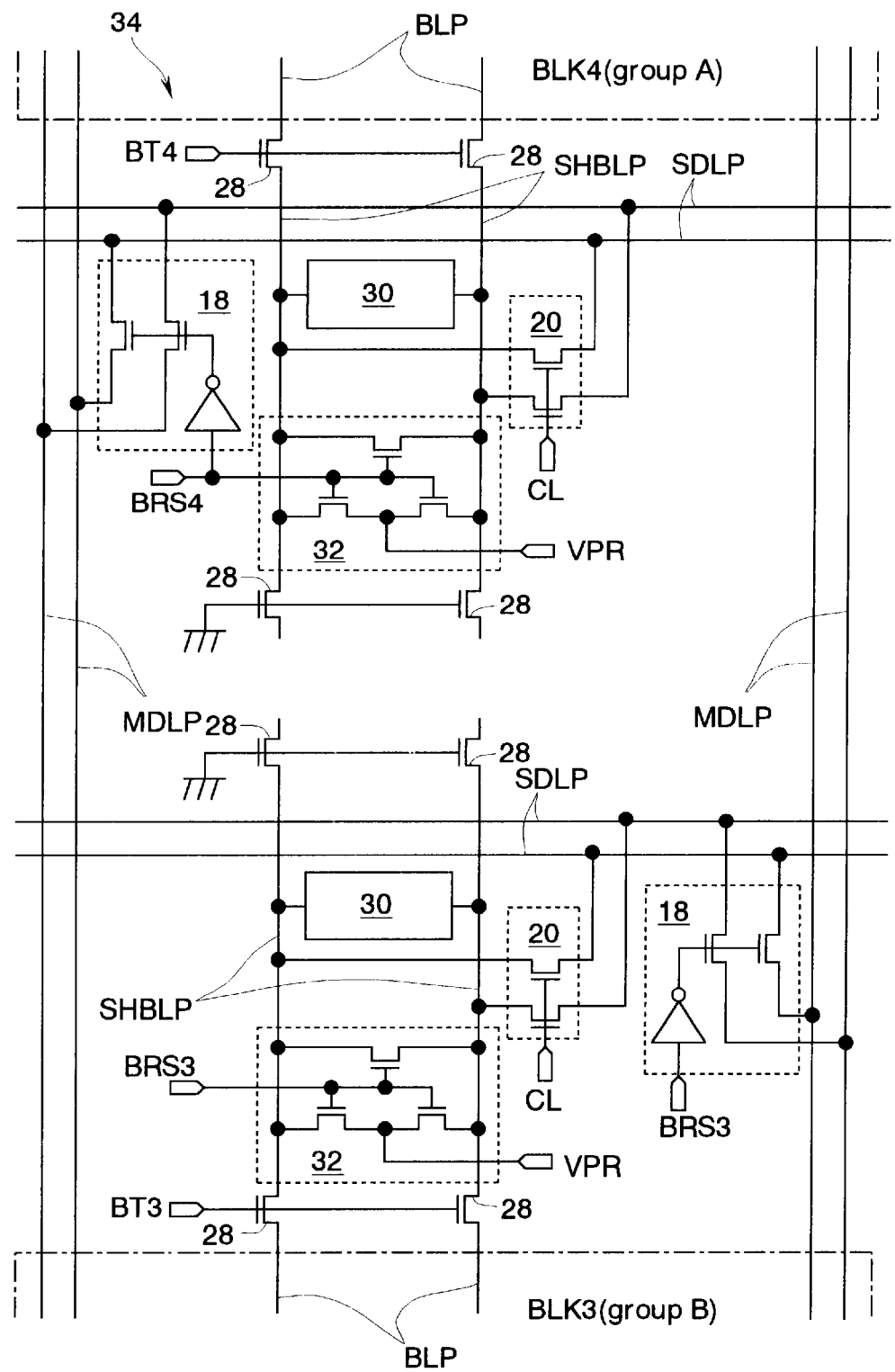
FIG. 4 is a circuit diagram showing controlling circuits formed between other blocks in the conventional SDRAM.
Figure 5:
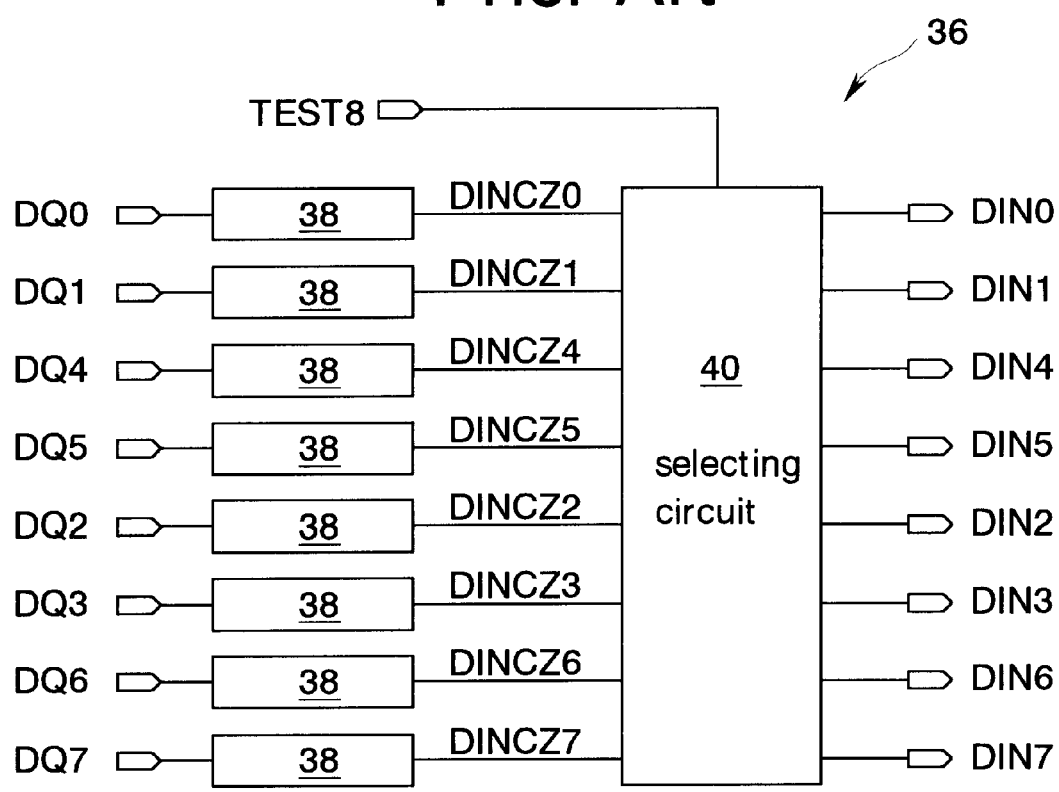
FIG. 5 is a block diagram showing a data compressing circuit of the conventional SDRAM.
Figure 6:
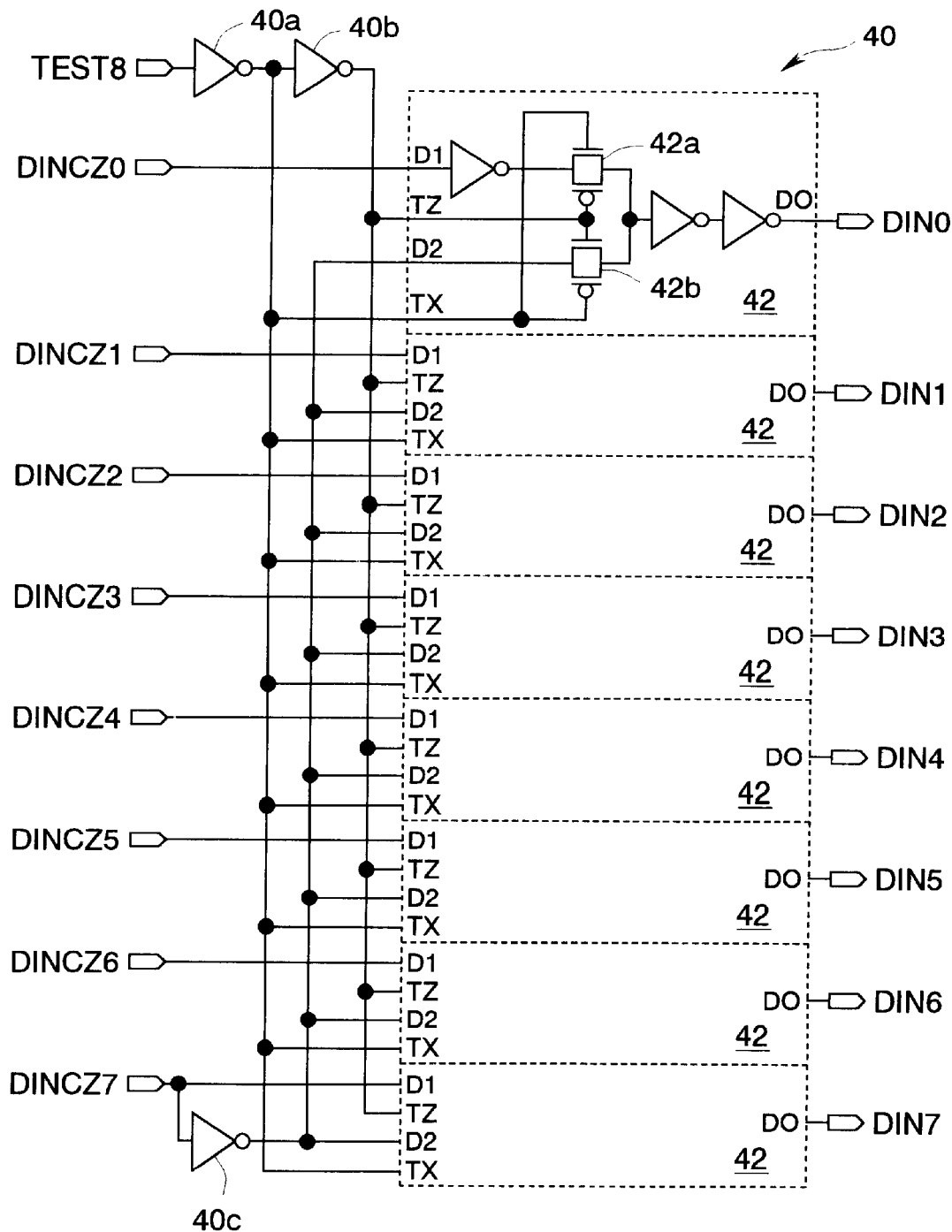
FIG. 6 is a circuit diagram showing the details of the selecting circuit in FIG. 5.

The bit line pairs BLP of the blocks BLK3 and BLK4 are connected to shared bit line pair SHBLP through bit line switches 28 consisting of nMOS transistors. The respective bit line switches 28 are controlled by control signals BT3 and BT4, which are activated in accordance with the column address. That is, the control signal BT3 is an activation signal that activates the bit line pair BLP of the block BLK3, and the control signal BT4 is an activation signal that activates the bit line pair BLP of the block BLK4. The shared bit line pair SHBLP is connected to a sense amplifier 30 and to a precharge circuit 32. The sense amplifier 30 and the precharge circuit 32 are shared by the blocks BLK3 and BLK4 through the bit line switches 28. Thus, the layout area of the control circuit 52 is significantly reduced, as compared with the conventional control circuit 34 (FIG. 4).

The shared bit line pair SHBLP is connected to sub data line pair SDLP through a column line switch 20 consisting of nMOS transistors. The gate of the column line switch 20 is controlled by the column line selecting signal CL that is activated in accordance with the column address. Two data line switches 18 are formed to connect the sub data line pairs SDLP to two main data line pairs MDLP. The gate of the data line switch 18 corresponding to group A is controlled through an inverter by the control signal BT3 that controls the block BLK3 (group B). The gate of data line switch 18 corresponding to group B is controlled through an inverter by the control signal BT4 that controls the block BLK4 (group A). In other words, the control signal BT3 activates the bit line switches 28 of the block BLK3, and at the same time, inactivates the data line switch 18 corresponding to the block BLK4. The control signal BT4 activates the bit line switches 28 of the block BLK4, and at the same time, inactivates the data line switch 18 corresponding to the block BLK3. Because the gates of the data line switches 18 are controlled by the inverted signals of the control signals BT3, BT4 of the respective other blocks, the control circuit is simplified.

For example, the read operation of the block BLK3 is executed when the control signal BT3 and the column line selecting signal CL are changed to the high level, and when the control signal BT4 and the precharge signal BRS are changed to the low level, thereby connecting the bit line pair BLP of the block BLK3, the shared bit line pair SHBLP, the shared sub data line pair SDLP, and the main data line pair MDLP corresponding to the group B.

Figure 10:
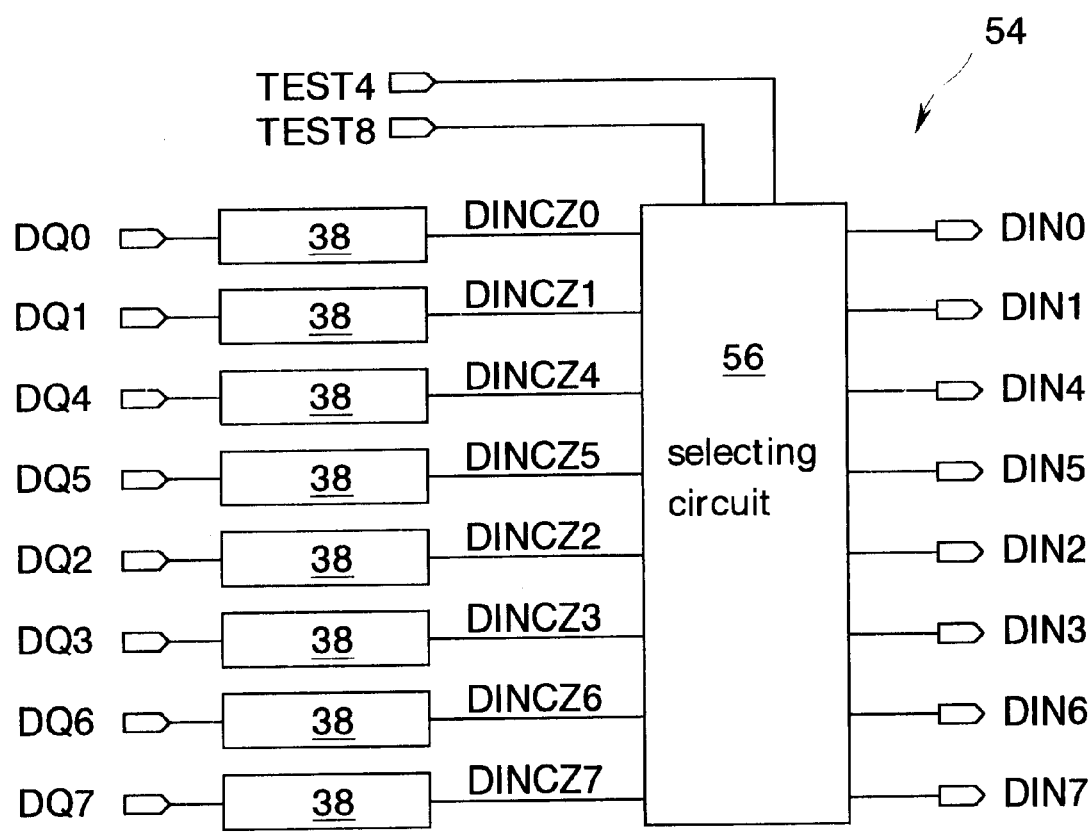
FIG. 10 is a block diagram showing a data compressing circuit in the first embodiment.

FIG. 10 shows a data compressing circuit 54 for write data.

The data compressing circuit 54 has eight buffer circuits 38 corresponding to the input/output data signals DQ0 to DQ7, respectively, and a selecting circuits 56. The selecting circuit 56 receives write data signals DINCZ0 to DINCZ7 and enable signals TEST4 and TEST8 for data compressing test, and outputs write data signals DIN0 to DIN7. The enable signal TEST4 changes to the high level when a 4-bit data compressing test is to be performed, and the enable signal TEST8 changes to the high level when an 8-bit data compressing test is to be performed. That is, the SDRAM in this embodiment has two kinds of compressing testing mode in which the bit number of the input/output data (input/output terminal number) can be compressed to one fourth or one eighth of the original number.

Figure 11:
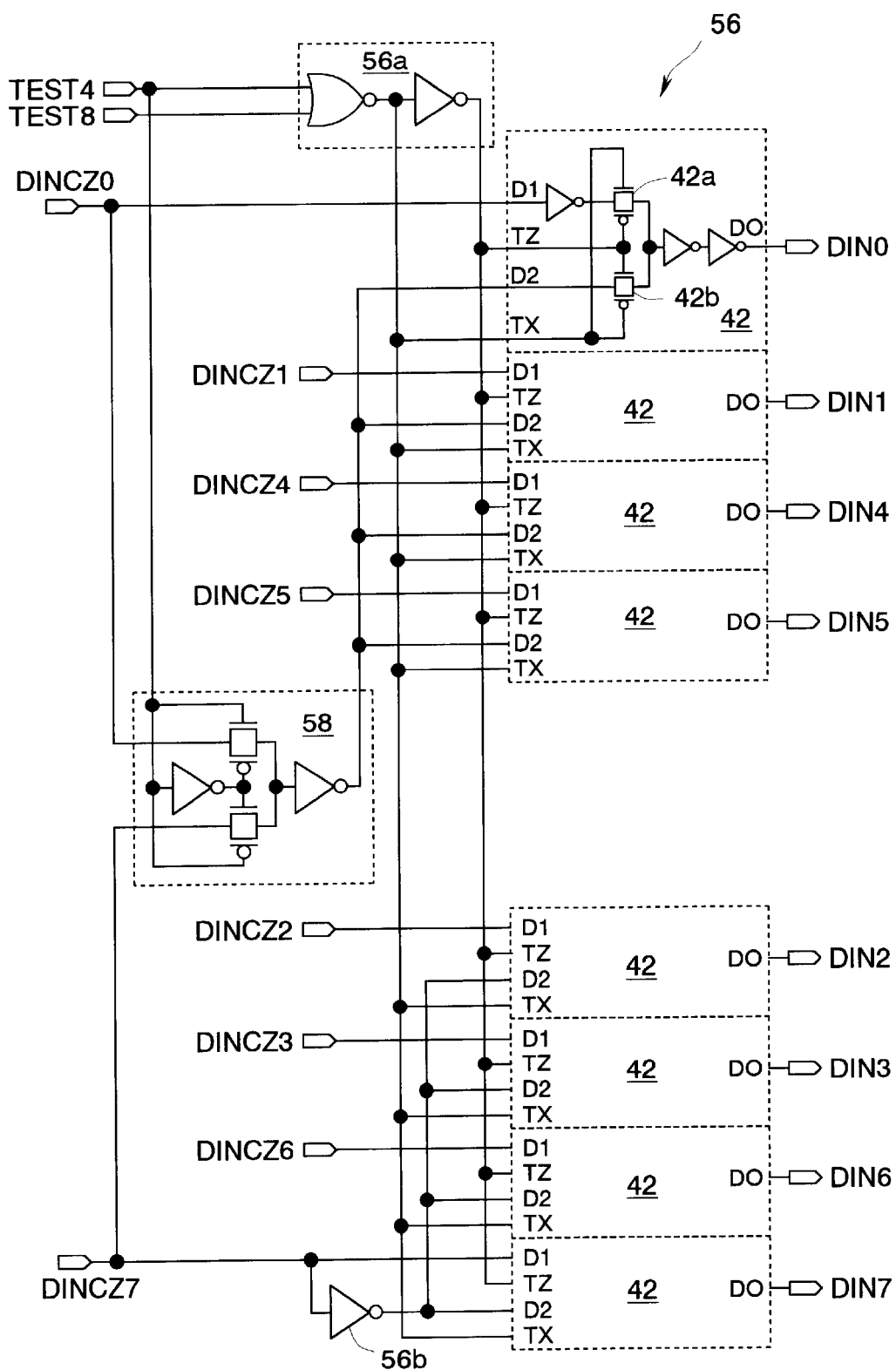
FIG. 11 is a circuit diagram showing the details of the selecting circuit in FIG. 10.

FIG. 11 shows the details of the selecting circuit 56.

The selecting circuit 56 is constructed of eight (1 byte) switching circuits 42 corresponding to the write data signal DINCZ0 to DINCZ7, respectively, an OR circuit 56a that controls the switching circuits 42, an inverter 56b, and a switching circuit 58 that selects data signals supplied to the switching circuits 42 corresponding to the write data signals DIN0, DIN1, DIN4, DIN5. The switching circuits 42 correspond to second switching circuits, and the switching circuit 58 corresponds to a first switching circuit. The switching circuit 58 is constructed of two CMOS transmission gates and two inverters. The switching circuit 58 outputs the inverted signal of the write data signal DINCZ0 when the enable signal TEST4 is at the high level, and outputs the inverted signal of the write data signal DINCZ7 when the enable signal TEST4 is at the low level.

The CMOS transmission gates 42a and 42b of each switch circuit 42 are controlled by a signal having the same phase as, and a signal having a phase opposite to, the signal obtained by the OR logic of the enable signals TEST 4 and TEST 8. The CMOS transmission gate 42a is turned on when the enable signals TEST 4 and TEST 8 are both at the low level (normal operation). The CMOS transmission gate 42b is turned on when one of the enable signals TEST4 and TEST8 is at the high level (4-bit data compressing test or 8-bit data compressing test). The terminals D2 of the selecting circuits 42 that correspond to the write data signals DIN0, DIN1, DIN4, DIN5 receive the inverted signal of either write data signal DINCZ0 or write data signal DINCZ7 through the switching circuit 58. The terminals D2 of the selecting circuits 42 that correspond to the write data signals DIN2, DIN3, DIN6, DIN7 receive the inverted signals of the write data signal DINCZ7 through the inverter 56b.

This way, in this embodiment, using the same switching circuit 42 as in the conventional art, multiple data compressing tests can be executed. This is because the selecting circuit 56 is constructed of two-step structure of switching circuits 42 and 58. That is, the switching circuits 42 select either normal data or testing data, and the switching circuit 58 formed in front of the switching circuits 42 selects one of the multiple testing data (the write data signals DINCZ0 and DINCZ7). Because the load of the write data signals DIN0 to DIN7 can be equal to that of the conventional art, timing design is made easier. Also, multiple testing data can be selected by a simple switching circuit 58, which is made of CMOS transmission gates. Thus, the control circuit for the data compressing test can be formed in the minimum layout area.

Next, the operation of the selecting circuit 56 is explained.

In the normal operation mode, the write data signals DINCZ 0–7 are transmitted as the write data signals DIN 0–7, respectively. Upon the operation of the 4-bit data compressing test, 4 bits input/output terminals a re compressed to 1 bit, and the write data signals DINCZ0 and DINCZ7 are transmitted as the write data signals DIN0, DIN1, DIN4, DIN5, and write data signals DIN2, DIN3, DIN6, DIN7, respectively. Upon the operation of the 8-bit compressing test, 8 bits input/output terminals are compressed to 1 bit, and the write data signal DINCZ7 is transmitted as all write data signals DIN0 to 7. Although not particularly shown in the figure, input/output data signals DQ8–15, DQ16–23, and DQ24–31 are controlled by selecting circuits that are identical to the selecting circuit 56.

An evaluation board of an LSI tester that evaluates these SDRAMs can execute the SDRAM read/write operating test using the input/output channels of only 4 bits (DQ7, DQ15, DQ23, DQ31) or only 8 bits (DQ0, DQ7, DQ8, DQ15, DQ16, DQ23, DQ24, DQ31). For example, by applying the 4-bit data compressing test to a defect relief test (test in wafer condition), only the word line relief circuit 22 of the block that has the actual defect can be used to relief the defect. Accordingly, even when the data compressing test is applied to relief determination, the number of SDRAMs that can be tested simultaneously by an LSI tester can be increased without lowering the relief efficiency (the usage efficiency of the word line relief circuits 22). Here, in order to increase the relief efficiency, defects to be found in the data compressing test have to be located within one block (for example, BLK0), which is the minimum unit of the word line relief circuits 22.

The application of the 8-bit data compressing test to the final test after assembling reduces the cost of the final test. Moreover, in the case of measuring the electrical characteristics such as access speed and power consumption, the normal operating mode can be used.

As described above, it is possible to select and execute the most efficient testing method in accordance with the testing process.

Also, sharing the sense amplifier 30 and precharge circuit 32 for blocks BLK3, BLK4 that have different DQ numbers makes it possible to significantly decrease the layout size of the control circuit 52, as compared with the conventional art.

Figure 12:
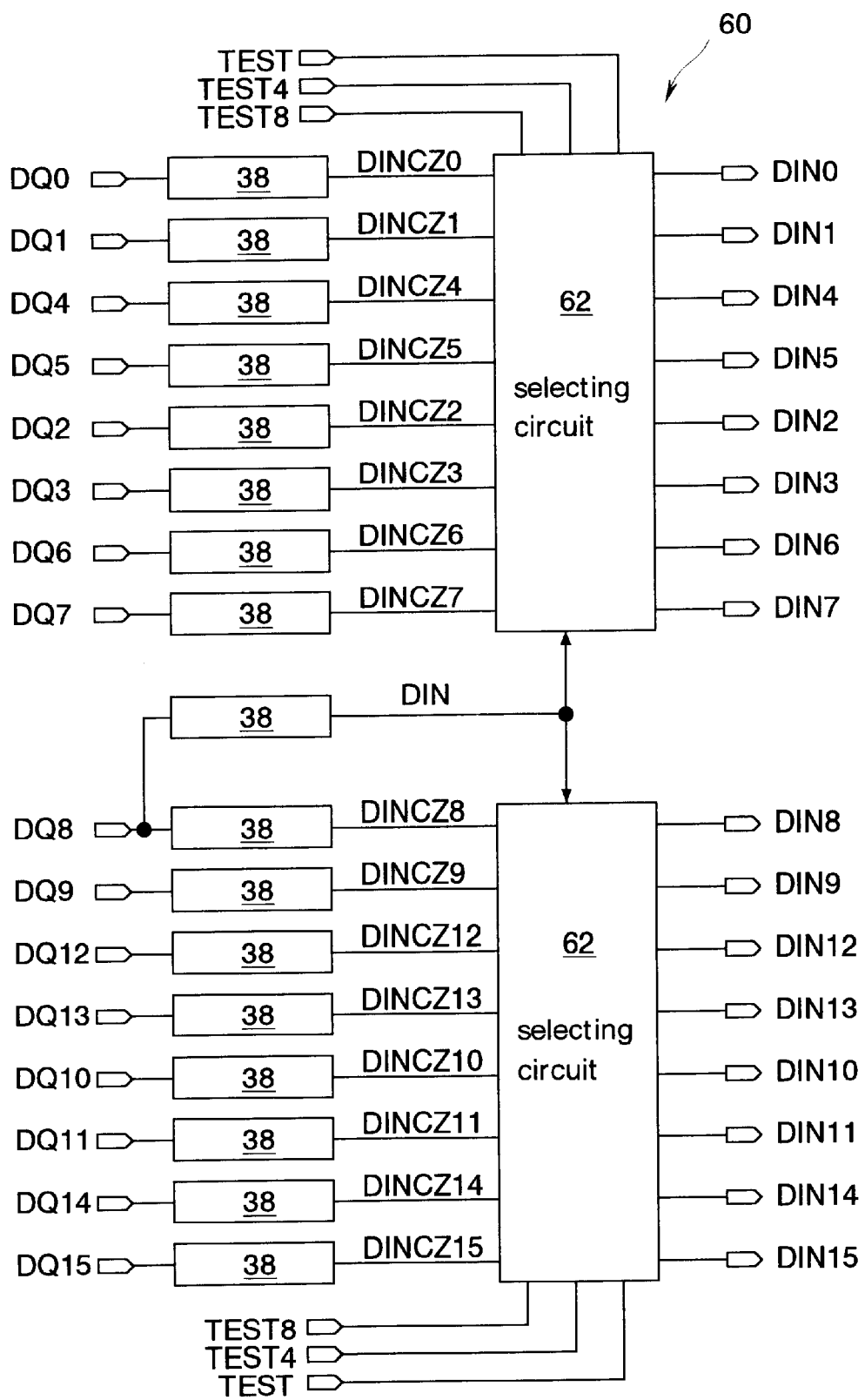
FIG. 12 is a block diagram showing a data compressing circuit in a second embodiment.

FIG. 12 shows a data compressing circuit 60 of a semiconductor integrated circuit according to a second embodiment of the present invention. The circuits that are the same as those of the first embodiment have the same reference characters, and the detailed explanations of such circuits are omitted. The SDRAM of the present embodiment has 16-bit input/output terminals.

The data compressing circuit 60 includes two of the data compressing circuits 54 of the first embodiment. The data compressing circuit 60 has sixteen buffer circuits 38 corresponding to input/output data signals DQ0 to DQ15, respectively, two selecting circuits 62, and a buffer circuit 38 that transmits write data signal DIN, which is testing data. The selecting circuit 62 corresponding to the input/output data signals DQ0 to DQ7 receives write data signals DINCZ0 to DINCZ7, enable signals TEST4, TEST8, TEST for data compressing tests, and the write data signal DIN, and outputs write data signals DIN0–DIN7. The selecting signals 62 corresponding to the input/output data signal DQ8 to DQ15 receives write data signals DINCZ8 to DINCZ15, enable signals TEST4, TEST8, TEST for data compressing tests, and the write data signals DIN, and outputs write data signals DIN8 to DIN15. The enable signal TEST4 becomes the high level when the 4-bit data compressing test is to be performed, the enable signal TEST8 becomes the high level when the 8-bit data compressing test is to be performed, and the enable signal TEST becomes the high level when the 16-bit data compressing test is to be performed. That is, the SDRAM of this embodiment has three kinds of data compressing test functions. The other structures are the same as those of the first embodiment except for the input/output terminals are 16 bits. In this embodiment the input/output terminals are 16 bits so DQ16 to DQ31 in groups E, F, G, H Correspond to DQ0 to DQ15 with addresses different from groups A, B, C, and D in the memory core 50 shown in FIG. 7, for example.

Figure 13:
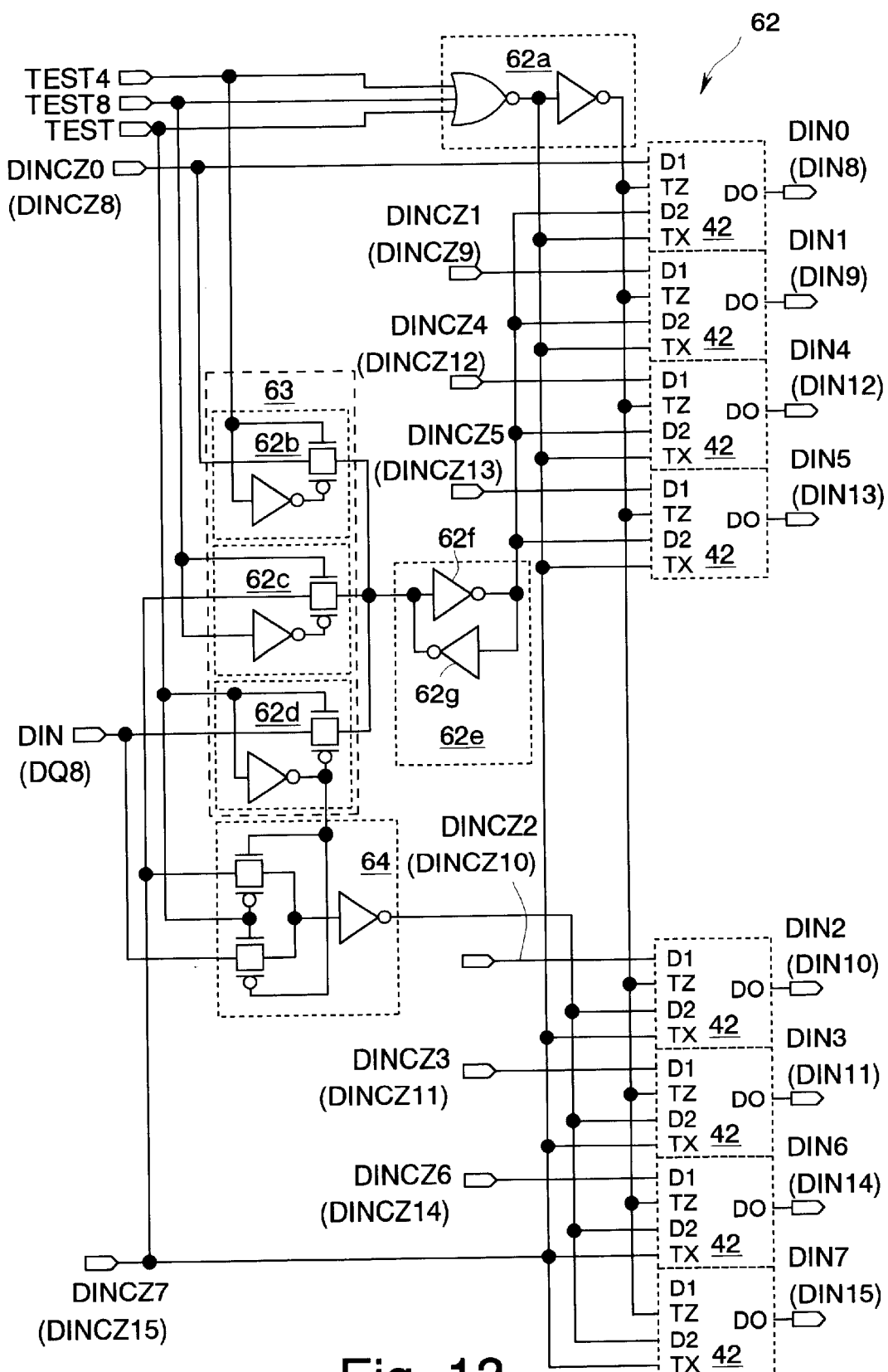
FIG. 13 is a circuit diagram showing the details of the selecting circuit in FIG. 12.

FIG. 13 shows the details of the selecting circuit 62 corresponding to the input/output data signals DQ0 to DQ7. Here, the names of the respective signals in the selecting circuit 62 corresponding to the input/output data signals DQ8 to DQ15 are shown in the brackets.

The selecting circuit 62 is constructed of eight switching circuits 42 corresponding to write data signal DINCZ0 to DINCZ7, respectively, an OR circuit 62a that controls these switching circuits 42, a switching circuit 63 including transmission circuits 62b, 62c, 62d, a latch 62e, and a switching circuit 64 that selects the data signals to be supplied to switching circuits 42 that correspond to the write data signals DIN2, DIN3, DIN6, DIN7. The switching circuits 63, 64 correspond to a first switching circuit.

The transmission circuits 62b, 62c, and 62d respectively are constructed of a CMOS transmission gate and an inverter that controls the transmission gate. When the enable signal TEST4 is at the high level, the transmission circuit 62b is turned on, and transmits the write data signal DINCZ0 to the latch 62e. When the enable signal TEST8 is at the high level, the transmission circuit 62c is turned on, and transmits the write data signal DINCZ7 to the latch 62e. When the enable signal TEST is at the high level, the transmission circuit 62d is turned on, and transmits the write data signal DIN (DQ8) to the latch 62e. The latch 62e is constructed of connecting the inputs and outputs of two inverters 62f, 62g together. The inverter 62g of the latch 62e prevents occurrence of a feedthrough current at the inverter 62f. That is, if the latch 62e is constructed of only the inverter 62f, when the output of the transmission circuits 62b, 62c, and 62d of the switching circuit 63 has a high impedance, the input of the inverter 62f becomes undefined. The inverter 62g eliminates this undefined condition.

The switching circuit 64 is constructed of two CMOS transmission gates and an inverter. The switching circuit 64 outputs the inverted signal of the write data signal DIN when the enable signal TEST is at the high level, and outputs the inverted signal of the write data signal DINCZ7 when the enable signal TEST is at the low level.

The CMOS transmission gates (not shown in the figure) of the switching circuits 42 are controlled by a signal having the same phase as, and a signal having a phase opposite to, the OR logic of the enable signals TEST4, TEST8, and TEST. That is, the switching circuits 42 each output the signal received at terminal D1 to the terminal D0 when all enable signals TEST4, TEST8, TEST are at the low level (normal operation). The switching circuits 42 each output the signal received at terminal D2 to the terminal D0 when one of the enable signals TEST4, TEST8, and TEST is at high level (one of the 4-bit data compressing test, 8-bit compressing test, and the 16-bit compressing test). The terminals D2 of the selecting circuits 42 that correspond to write data signals DIN0, DIN1, DIN4, DIN5 receive the inverted signal of one of DINCZ0, DINCZ27 and DIN (DQ8) through the latch 62e. The terminals D2 of the selecting circuits 42 that correspond to write data signals DIN2, DIN3, DIN6, DIN7 receive the inverted signal of the data signal DINCZ7, or the inverted signal of the write data signal DIN, through the switching circuit 64. That is, under the normal operation, the write data signals DINZC 0–7 are transmitted as the write data signals DIN 0–7, respectively.

In the operation of the 4-bit data compressing test, 4 bits of the input/output data are compressed to 1 bit, and the inverted signal of the write data signal DINCZ0 and the inverted signal of DINCZ7 are transmitted as the write data signals DIN0, DIN1, DIN4, DIN5, and as the write data signals DIN2, DIN3, DIN6, DIN7, respectively. At this time, at the selecting circuit 62 that corresponds to the input/output data signals DQ8 to DQ15, the inverted signal of the write data signal DINCZ8 and the inverted signal of DINCZ15 are transmitted as the write data signal DIN8, DIN9, DIN12, DIN13, and as the write data signals DIN10, DIN11, DIN14, DIN15, respectively. The 4-bit data compressing test is used for relief determination and the like in a manner similar to the first embodiment. In the operation of the 8-bit data compressing test, eight bits of the input/output data are compressed to 1 bit, and the inverted signal of write data signal DINCZ7 is transmitted as the write data signals DIN0–7 At this time, at the selecting circuit 62 that corresponds to the input/output data signals DQ8 to DQ15, the inverted signal of the write data signal DINCZ15 is transmitted as the write data signals DIN 8–15. The 8-bit data compressing test is used in the final test after assembling and the like.

In the operation of the 16-bit data compressing test, 16 bits of the input/output data are compressed to 1 bit, and the write data signal DIN (DQ8) is transmitted as the write data signals DIN 0–7. At this time, at the selecting circuit 62 that corresponds to the input/output data signals DQ8 to DQ15, the write data signal DIN (DQ8) is transmitted as the write data signals DIN 8–15. The 16-bit data compressing test is used in wafer burn-in test, which will be described later.

Here, each selecting circuit 62 receives not the write data signal DINCZ8 used in the normal operation but a write data signal DIN, which is generated by a buffer circuit 38 dedicated to testing purpose. Accordingly, the load of the write data signal DINCZ8 becomes the same as the loads of other write data signals DINCZ 0–7 and DINCZ 9–15. Therefore, during the normal operation, the write timing of the write data signal DINCZ8 is not delayed.

Figure 14:
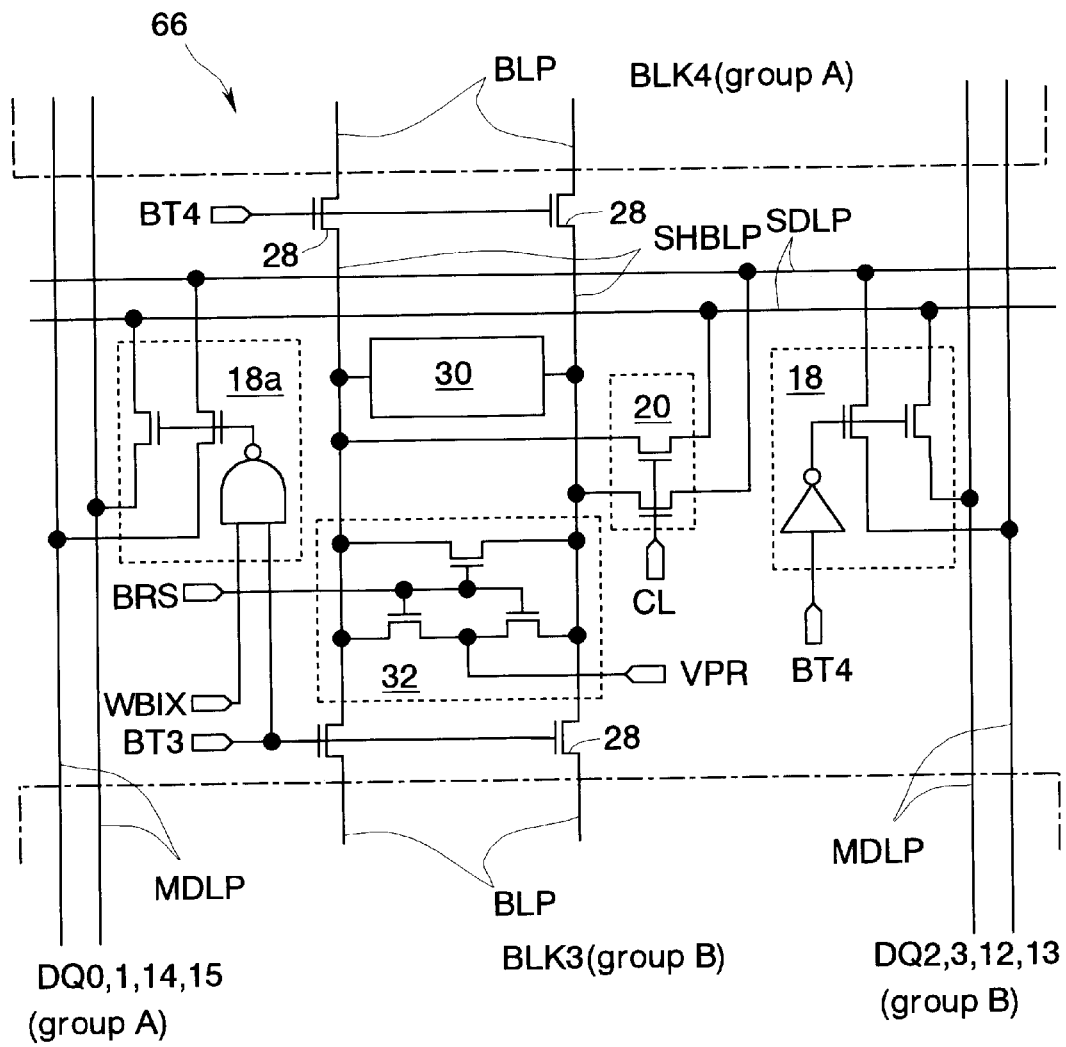
FIG. 14 is a circuit diagram showing a control circuit formed between blocks in the second embodiment.

FIG. 14 shows a control circuit 66 formed between the blocks BLK3 and BLK4.

In the control circuit 66, the gate of the data line switch 18a corresponding to DQ0, DQ1, DQ14, DQ15 is controlled by a NAND gate. The other structures of the control circuit 66 are the same as those of the control circuit 52 shown in FIG. 9. The NAND gate receives control signal BT3 at one input, and receives testing mode signal WBIX at the other input. The testing mode signal WBIX is a signal that is activated (low level) upon wafer burn-in testing. In this embodiment, the wafer burn-in test is executed using the 16-bit data compressing testing mode, which is the most efficient. The wafer burn-in test is a test where burn-in is performed at once on a plurality of SDRAMs on a wafer. In the wafer burn-in test, a high voltage is applied directly to the word lines or the like by using test pads on the chip so that a large number of SDRAMs can be screened in a short time.

In the wafer burn-in test, all of the memory cells on the chip are selected so that all the control signals BT3 and BT4 go to high level. At this time, the data line switches 18 are turned off. The write data is transmitted to memory cells through the data line switches 18a, which are turned on upon receipt of the testing mode signal WBIX data that is at the low level. That is, the wafer burn-in test is executed by using the data compressing testing mode.

In this embodiment, effects similar to the above-mentioned effects of the first embodiment can be obtained. Moreover, in this embodiment the latch 62e that latches the testing data is provided between the switching circuit 63 and the switching circuits 42, which prevents undefined at the input of the inverter 62f when the outputs of the transmission circuits 62b, 62c, 62d of the switching circuit 63 have a high impedance and further prevents occurrence of a feedthrough current in the inverter 62f.

Further provided is the buffer circuit 38 dedicated to receiving input/output data signal DQ8 and supplying the received signal to switching circuits 63, 64 as the write data signal DIN. Therefore, the write data signals DINCZ0 to DINCZ15 supplied to the switching circuits 42 have an equal load. This prevents an undesirable shift of the timing of supplying the particular bit (DQ8) used in the data compressing testing mode, to the switching circuit 42.

A logic of the testing mode signal WBIX is added to the control of the data line switch 18a, and the data line switch 18a is turned on at the time of wafer burn-in testing. Accordingly, use of one main data line pair MDLP enables writing of input/output data with respect to other blocks corresponding to other main data line pairs MDLP. That is, when the wafer burn-in test is executed, the write data can be compressed. As a result, in the burn-in test, it is possible to minimize the number of probes, which are in contact with the pads on a chip for supplying write data.

Figure 15:
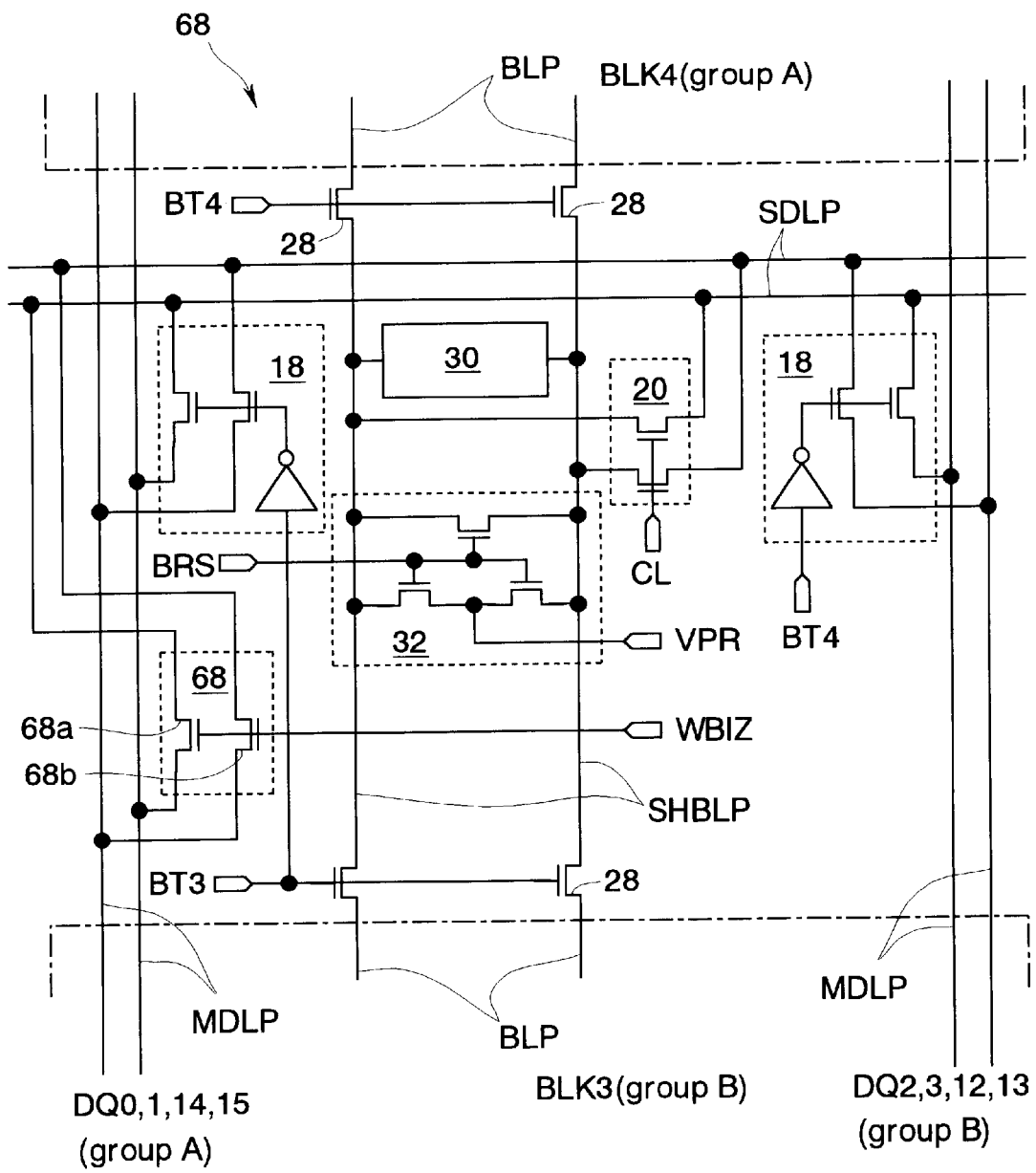
FIG. 15 is a circuit diagram showing a control circuit formed between blocks in a third embodiment.

FIG. 15 shows a third embodiment of a semiconductor integrated circuit of the present invention. The same circuits as in the first embodiment are assigned the same reference characters, and the detailed explanations of such circuits are omitted.

A control circuit 68 of this embodiment is constructed by adding nMOS transistors 68a and 68b to the control circuit 52 of the first embodiment. The nMOS transistors 68a, 68b are turned on when testing mode signal WBIZ that is at the high level is received, and connects the main data line pair MDLP to the sub data line pair SDLP. The testing mode signal WBIZ is a signal that is activated (high level) at the time of the wafer burn-in test.

In this embodiment, effects similar to the above-mentioned effects of the second embodiment can be obtained. Moreover, in this embodiment, because the control circuit 68 is constructed by adding the nMOS transistors, the layout area between the blocks BLK3 and BLK4 can be made smaller.

Figure 16:
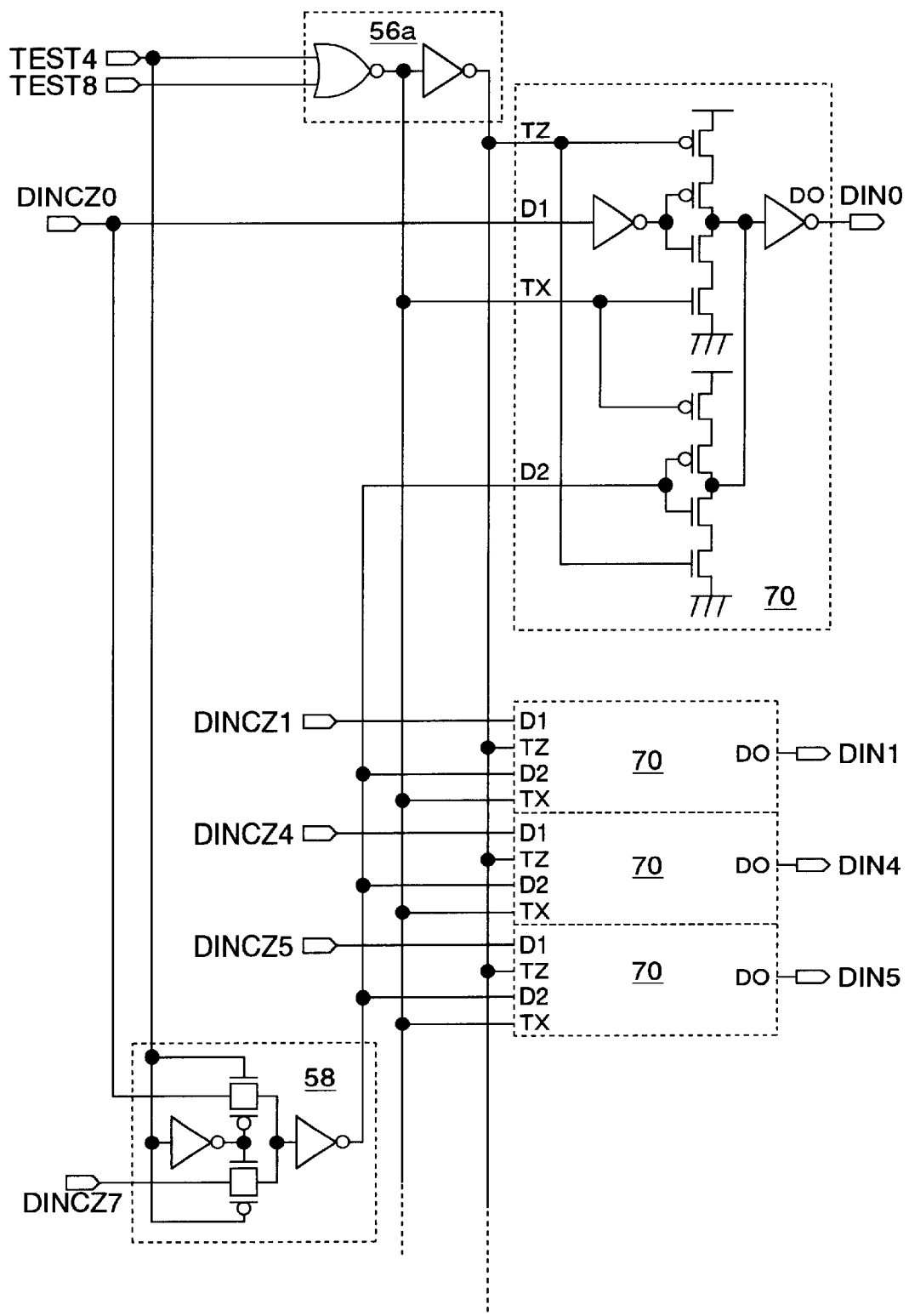
FIG. 16 is a circuit diagram showing another example of the selecting circuit.
Figure 17:
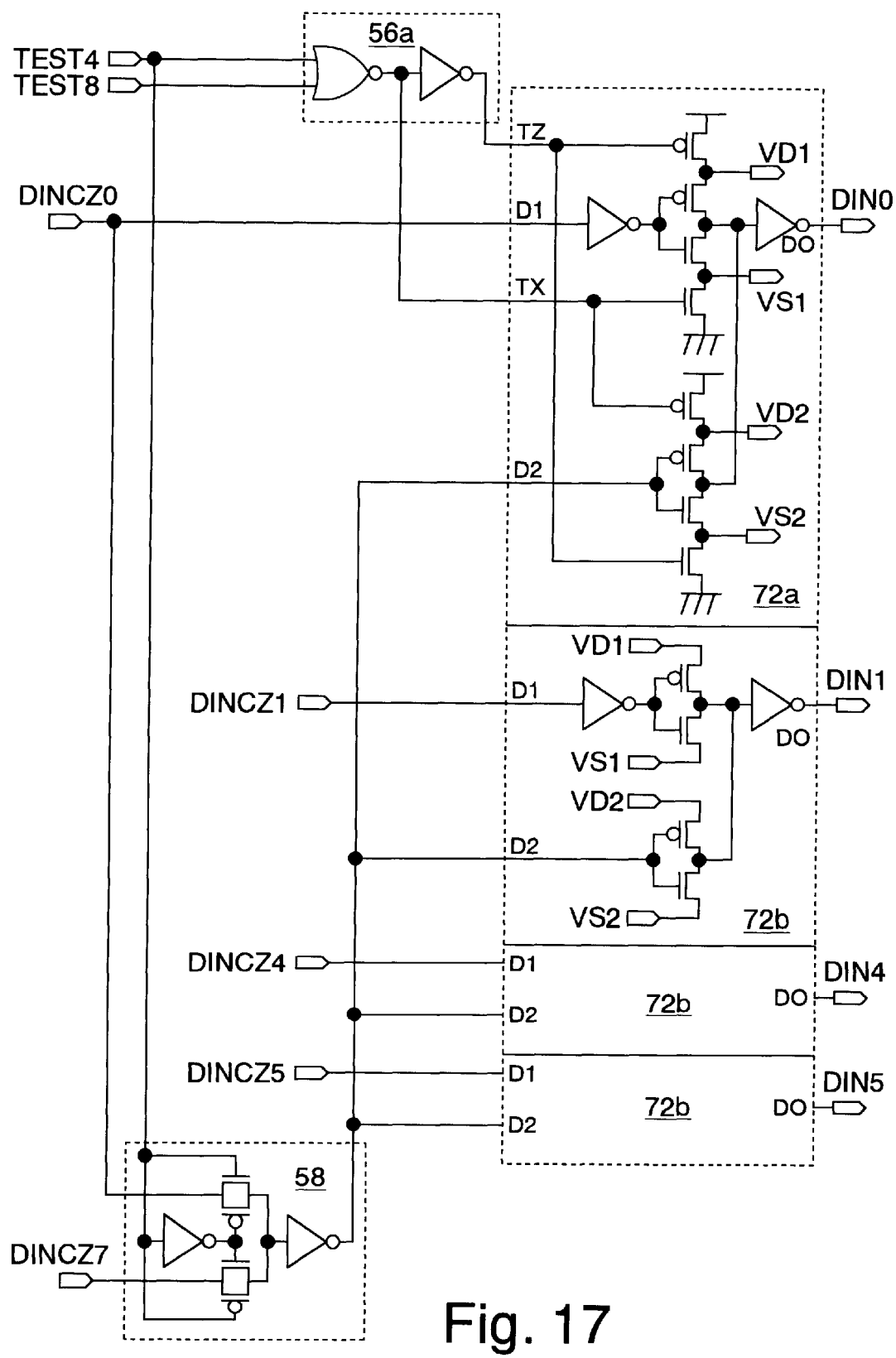
FIG. 17 is a circuit diagram showing still another example of the selecting circuit.

As shown in FIG. 11, in the above-mentioned first embodiment, an example where the switching circuits 42 are constructed of CMOS transmission gates was explained. The present invention is not limited to such an example of the embodiment. For example, as shown in FIG. 16, switching circuits 70 may be constructed of clocked inverters. Alternatively, as shown in FIG. 17, a switching circuit 72a having clocked inverters and switching circuits 72b having inverters that utilize the power sources VD1, VS1, VD2, and VS2 from the switching circuit 72a may be constructed. The switching circuit 72a outputs voltages VD1, VS1, VD2, VS2 from the drains of PMOS transistors and nMOS transistors at the power source side of the clocked inverters, respectively. At the switching circuits 72b, these voltages VD1, VS1, VD2, VS2 are received by the sources of PMOS transistors and nMOS transistors, respectively. Thus, in the switching circuits 72b, the pMOS and nMOS transistors for control use can be eliminated.

In the above-mentioned first embodiment, an example of constructing the data line switches 18 by nMOS transmission gates was explained. However, the present invention is not limited to such an example of the embodiment. If the layout area has enough space, the data line switches 18 may be constructed by CMOS transmission gates.

In the above-mentioned first embodiment, an example of using the write data DINCZ0, DINCZ7 at the time of the data compressing test was explained. However, the present invention is not limited to such an example of the embodiment. The bits used for the write data may be arbitrarily determined.

In the above-mentioned second embodiment, an example of connecting the main data line pair MDLP that corresponds to DQ0, DQ1, DQ14, DQ15 to the sub data line pair SDLP through the data line switch 18a was explained.

However, the present invention is not limited to such an example of the embodiment. For example, the main data line pair MDLP that corresponds to DQ2, DQ3, DQ12, DQ13 may be connected to sub data line pair SDLP through the data line switch 18a. Further, main data line pairs MDLP that correspond to DQ0, DQ1, DQ14, DQ15 and DQ2, DQ3, DQ12, DQ13 may be connected to the sub data line pair SDLP through the respective data line switches 18a.

In the above-mentioned second embodiment, an example of connecting the inputs and outputs of two inverters to form the latch 62e was explained (FIG. 13). However, the present invention is not limited to such an example of the embodiment. For example, one of the inverters may be replaced by a NAND gate, and a power-on reset signal, which is activated (low level) when the power is turned on, or a control signal including the logic of such a power-on reset signal, may be provided to the other input of the NAND gate. With this construction, the NAND gate operates as a reset circuit, and the latch is initialized when the power is on with certainty. In addition, occurrence of a feedthrough current can be prevented.

In the above-mentioned second embodiment, an example of applying the present invention to the wafer burn-in test was explained. However, the present invention is not limited to such an example of the embodiment. For example, the present invention may be applied to the SDRAM burn-in test after assembling.

In the above-mentioned third embodiment, an example of connecting the main data line pair MDLP that corresponds to DQ0, DQ1, DQ14, DQ15 to the sub data line pair MDLP through nMOS transistors 68a, 68b was explained. However, the present invention is not limited to such an example of the embodiment.

For example, the main data line pair that corresponds to DQ2, DQ3, DQ12, DQ13 may be connected to the sub data line pair SDLP through nMOS transistors 68a, 68b. Further, the main data line pairs MDLP that correspond to DQ0, DQ1, DQ14, DQ15 and DQ2, DQ3, DQ12, DQ13 may be connected to the sub data line pair SDLP through the respective nMOS transistors 68a, 68b.

In the above-mentioned embodiments of the present invention, examples of applying the present invention to SDRAMs having sixteen or thirty-two input/output terminals were explained. However, the present invention is not limited to such examples of these embodiments. For example, the present invention may be applied to SDRAMs having sixty-four or more input/output terminals.

In the above-mentioned embodiments, examples of applying the present invention to SDRAMs were explained. However, the present invention is not limited to such examples of these embodiments. For example, the present invention may be applied to normal DRAMs and SRAMs, which are of clock asynchronous type. Further, the present invention may be applied to a system LSI that implements a DRAM memory core.

In addition, the semiconductor manufacturing processes to which the present invention can be applied include not only CMOS processes but also Bi-CMOS processes.

The invention is not limited to the above embodiments and various modifications may be made without departing from the spirit and the scope of the invention. Any improvement may be made in part or all of the components.

What is claimed is:

1. A semiconductor integrated circuit comprising:
    a plurality of input/output terminals for transmitting input/output data;
    a plurality of memory cells for retaining said input/output data;
    a first switching circuit for selecting data of a predetermined bit from said input/output data in accordance with each of a plurality of testing modes and outputting the selected data as testing data; and
    a plurality of second switching circuits respectively formed in correspondence with each of said plurality of input/output terminals, for receiving said testing data and each bit of said input/output data, for respectively selecting each bit of said input/output data during a normal operation mode and selecting said testing data during each of said testing modes, and for outputting the selected data to said memory cells.

2. The semiconductor integrated circuit according to claim 1, further comprising a plurality of memory cell arrays assigned a plurality of bits different from each other and having a relief circuit for relieving a defect which occurs at a predetermined address, and wherein
    the number of said second switching circuits for receiving the same testing data during said testing mode is set less than or equal to the number of said bits respectively assigned to each of said memory cell arrays.

3. The semiconductor integrated circuit according to claim 1, further comprising a latch, between said first switching circuit and said second switching circuit, for retaining said testing data.

4. The semiconductor integrated circuit according to claim 3, wherein said latch comprises a reset circuit for resetting said latch to a predetermined state upon receipt of a reset signal that is activated when the power is turned on.

5. The semiconductor integrated circuit according to claim 1, further comprising a buffer for respectively supplying said input/output data to said second switching circuits, and wherein
    said first switching circuit is supplied with said input/output data transmitted at a node between said buffer and said input/output terminals.

6. A semiconductor integrated circuit comprising:
    first and second data terminal for outputting read data;
    first and second data bus lines corresponding to said first and second data terminals, respectively, for transmitting said read data to said first and second data terminals;
    first and second memory cell array blocks;
    a sense amplifier shared by said first and second memory cell array blocks, for amplifying data from selected one of said first and second memory cell array blocks; and
    data line switches for connecting said sense amplifier with one of said first and second data bus lines in response to memory cell array block control signals.

7. The semiconductor integrated circuit according to claim 6, further comprising:
    shared bit line connected with said sense amplifier; and
    bit line switches for respectively connecting said first and second memory cell array blocks with said shared bit line; and wherein
    one of said memory cell array block control signals for activating one of said bit line switches corresponding to one of said first and second memory cell array blocks is used for inactivating one of said data line switches corresponding to the other memory cell array block.

8. The semiconductor integrated circuit according to claim 6, having a testing mode wherein said plurality of bit line switches are concurrently turned on to write data at once to both the first and second memory cell array blocks, and wherein said data line switches corresponding to said first and second memory cell array blocks respectively are turned on during said testing mode.

9. The semiconductor integrated circuit according to claim 8, wherein said testing mode is a burn-in testing mode wherein all word lines connected with memory cells in said first and second memory array blocks are activated so as to apply stress to said memory cells.

* * * * *